United States Patent
Lee et al.

(10) Patent No.: US 9,959,933 B2
(45) Date of Patent: May 1, 2018

(54) NON-VOLATILE MEMORY DEVICES AND METHODS OF OPERATING THE SAME

(71) Applicant: SAMSUNG ELECTRONICS CO., LTD., Suwon-si, Gyeonggi-Do (KR)

(72) Inventors: Ho-Jun Lee, Uiwang-si (KR); Sang-Hyun Joo, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/670,290

(22) Filed: Aug. 7, 2017

(65) Prior Publication Data

US 2017/0337981 A1   Nov. 23, 2017

Related U.S. Application Data

(62) Division of application No. 15/292,417, filed on Oct. 13, 2016, now Pat. No. 9,747,997.

(30) Foreign Application Priority Data

Dec. 11, 2015   (KR) ........................ 10-2015-0177371

(51) Int. Cl.

| | |
|---|---|
| G11C 29/00 | (2006.01) |
| G11C 16/34 | (2006.01) |
| G11C 16/10 | (2006.01) |
| G11C 16/16 | (2006.01) |
| G11C 16/26 | (2006.01) |
| G11C 16/08 | (2006.01) |
| G11C 16/04 | (2006.01) |

(52) U.S. Cl.
CPC ...... *G11C 16/3495* (2013.01); *G11C 16/0483* (2013.01); *G11C 16/08* (2013.01); *G11C 16/10* (2013.01); *G11C 16/16* (2013.01); *G11C 16/26* (2013.01); *G11C 16/3445* (2013.01); *G11C 16/3459* (2013.01)

(58) Field of Classification Search
CPC . G11C 16/3495; G11C 16/0483; G11C 16/08; G11C 16/10
USPC .................. 365/200, 185.17, 185.11, 185.18
See application file for complete search history.

(56) References Cited

U.S. PATENT DOCUMENTS

| | | | |
|---|---|---|---|
| 9,224,502 B1 * | 12/2015 | Sabde ................ | G11C 16/3459 |
| 2014/0085989 A1 | 3/2014 | Fukuzumi | |
| 2014/0219024 A1 | 8/2014 | Ogi et al. | |

(Continued)

OTHER PUBLICATIONS

Notice of Allowance dated May 1, 2017 related to U.S. Appl. No. 15/292,417.

*Primary Examiner* — Vu Le

(74) *Attorney, Agent, or Firm* — F. Chau & Associates, LLC

(57) ABSTRACT

A method of operating a non-volatile memory device includes selecting a first select transistor from among a plurality of select transistors included in a NAND string, and performing a check operation on a first threshold voltage of the first select transistor. The check operation includes comparing the first threshold voltage with a first lower-limit reference voltage level, and performing a program operation on the first select transistor when the first threshold voltage is lower than the first lower-limit reference voltage level. When the first threshold voltage is equal to or higher than the first lower-limit reference voltage level, the check operation on the first threshold voltage is ended.

4 Claims, 28 Drawing Sheets

(56) References Cited

U.S. PATENT DOCUMENTS

2015/0262699 A1* 9/2015 Shirakawa ......... G11C 16/3445
365/185.11
2017/0169897 A1  6/2017 Lee et al.

* cited by examiner

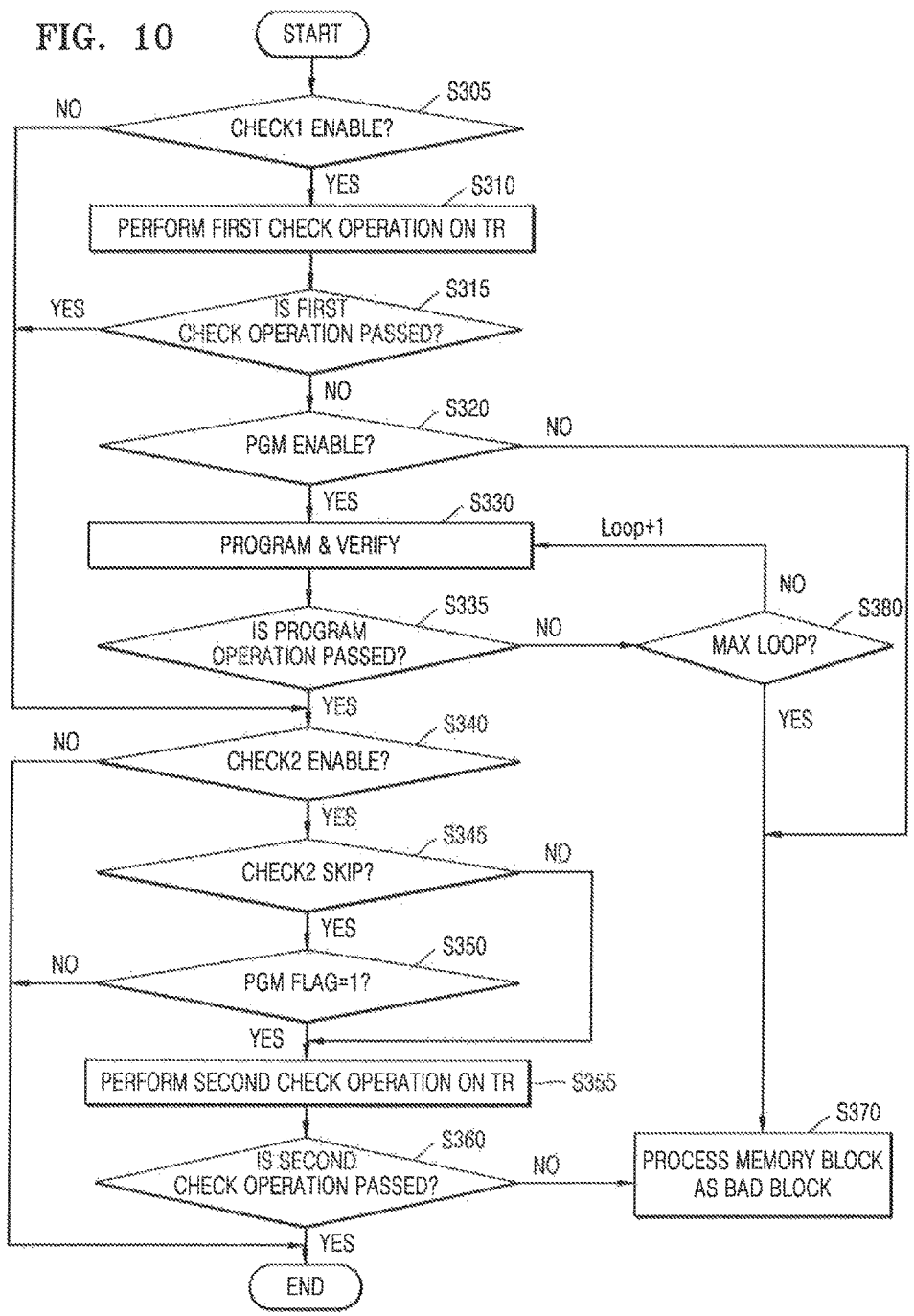

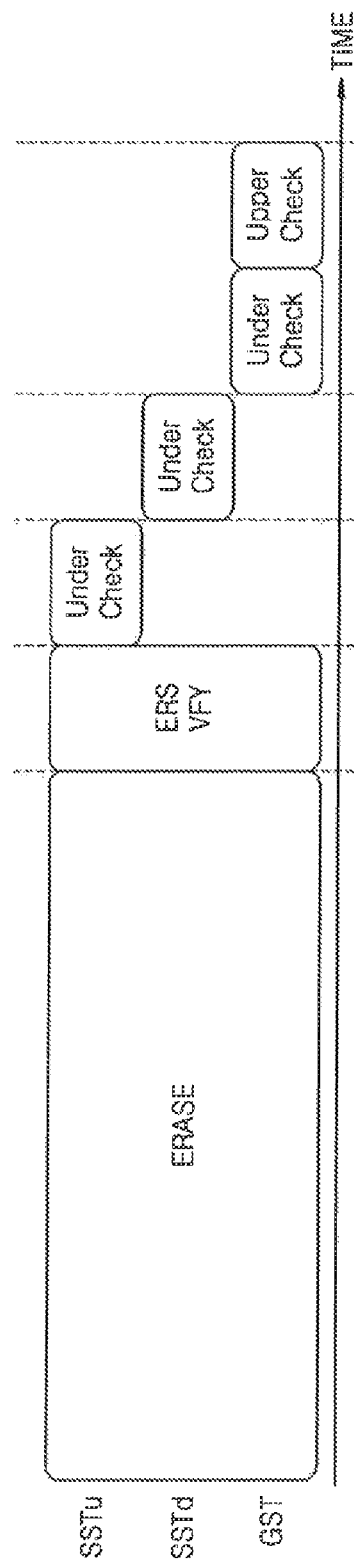

NON-VOLATILE MEMORY DEVICES AND METHODS OF OPERATING THE SAME

CROSS-REFERENCE TO RELATED APPLICATION

This application is a divisional application of U.S. application Ser. No. 15/292,417 filed Oct. 13, 2016, which claims priority under 35 U.S.C. § 119 to Korean Patent Application No. 10-2015-0177371, filed on Dec. 11, 2015, in the Korean Intellectual Property Office, the disclosures of which are incorporated by reference herein in their entireties.

TECHNICAL FIELD

Exemplary embodiments of the inventive concept relate to a memory device, and more particularly, to memory devices and memory systems capable of checking a bad block based on a threshold voltage of a select transistor and methods of operating the memory devices.

DISCUSSION OF RELATED ART

Memory devices may be used to store data and may be classified as volatile memory devices or non-volatile memory devices. A volatile memory device loses data in the absence of power, whereas a nonvolatile memory device does not. A flash memory device, which is an example of a non-volatile memory device, may be used for portable phones, digital cameras, personal digital assistants (PDAs), transportable computer devices, fixed computer devices, and other devices.

Nonvolatile memory devices have select transistors whose threshold voltage distributions change over time due to program/erase cycles, random deterioration, etc. Changes in the threshold voltage distributions of the select transistors may deteriorate the performance of the nonvolatile memory device. Check operations may be performed on threshold voltages of select transistors within the nonvolatile memory devices by using an on-chip operation to detect bad memory blocks.

SUMMARY

According to an exemplary embodiment of the inventive concept, a method of operating a non-volatile memory device is provided. The method includes selecting a first select transistor from among a plurality of select transistors included in a NAND string, and performing a first check operation on a first threshold voltage of the first select transistor. Performing the first check operation includes comparing the first threshold voltage with a first lower-limit reference voltage level, and performing a program operation on the first select transistor when the first threshold voltage is lower than the first lower-limit reference voltage level. When the first threshold voltage is equal to or higher than the first lower-limit reference voltage level, the first check operation on the first threshold voltage is ended.

According to an exemplary embodiment of the inventive concept, a method of operating a non-volatile memory device is provided. The non-volatile memory device includes first and second memory planes independently controllable of one another. Each of the first and second memory planes includes a plurality of memory blocks, and each of the plurality of memory blocks includes a plurality of NAND strings. The method includes selecting a first select transistor from among a plurality of select transistors included in a first NAND string of a first memory block of each of the first and second memory planes, checking whether a first threshold voltage of the first select transistor of each of the first and second memory planes is within a first reference voltage range, processing the first memory block of the first memory plane as a bad block when the first threshold voltage of the first select transistor of the first memory plane is not within the first reference voltage range, and processing the first memory block of the second memory plane as a bad block when the first threshold voltage of the first select transistor of the second memory plane is not within the first reference voltage range. When both the first memory block of the first memory plane and the first memory block of the second memory plane are processed as bad blocks, a check operation on the remaining select transistors out of the plurality of select transistors is skipped.

According to an exemplary embodiment of the inventive concept, a method of operating a non-volatile memory device is provided. The non-volatile memory device includes a memory cell array, the memory cell array includes a plurality of memory blocks, each of the plurality of memory blocks includes a plurality of strings, and each of the plurality of strings includes a plurality of string select transistors. The method includes selecting a sequence out of a plurality of predefined sequences, where the sequence indicates that a first select transistor, a second select transistor, and a third select transistor of the same string are to be checked in that order, performing the first check operation on the threshold voltage of the first select transistor, performing the second check operation on the threshold voltage of the second select transistor, and performing the third check operation on the threshold voltage of the third select transistor. The first select transistor is an upper string select transistor, the second select transistor is a lower string select transistor, and the third select transistor is a ground select transistor.

BRIEF DESCRIPTION OF THE DRAWINGS

The above and other features will be more clearly understood by describing in detail exemplary embodiments thereof with reference to the accompanying drawings.

FIG. 10 is a flowchart of an operation of checking a select transistor according to an exemplary embodiment of the inventive concept.

FIG. 11 is a diagram of an erase operation of a memory device, which includes an operation of checking select transistors, according to an exemplary embodiment of the inventive concept.

DETAILED DESCRIPTION OF THE EMBODIMENTS

Figure 1:
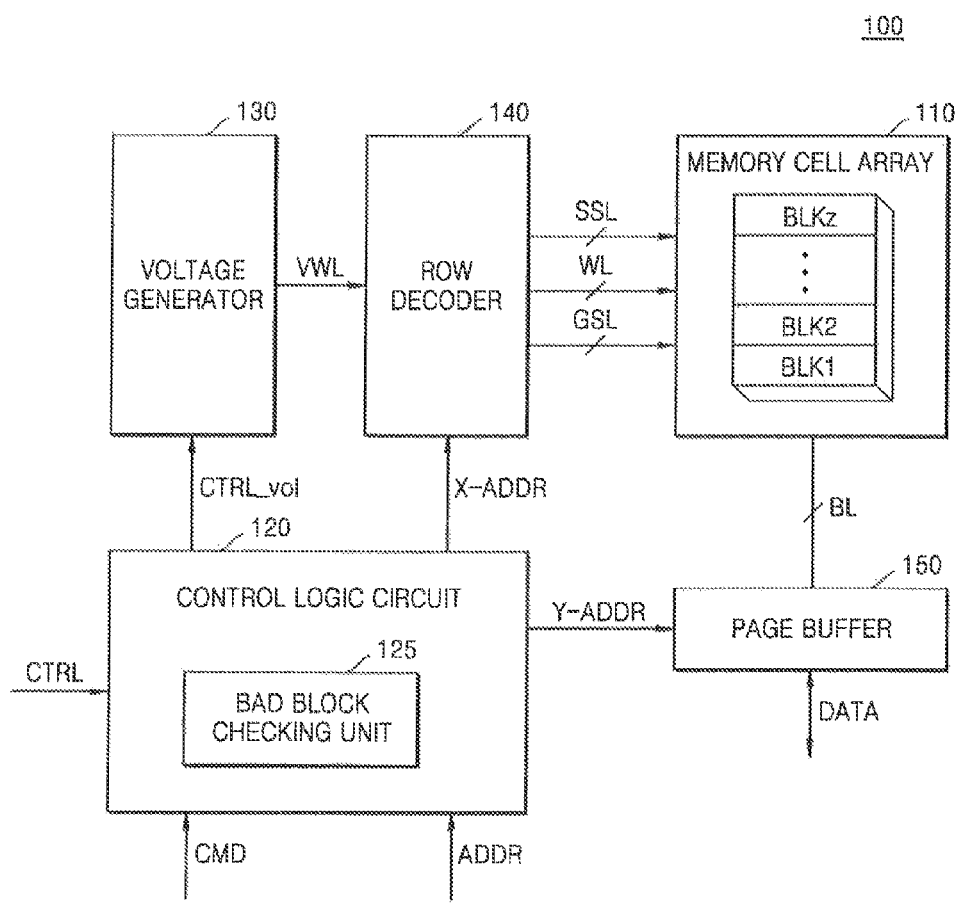
FIG. 1 is a block diagram of a memory device according to an exemplary embodiment of the inventive concept.

FIG. 1 is a block diagram of a memory device 100 according to an exemplary embodiment of the inventive concept.

Referring to FIG. 1, the memory device 100 may include a memory cell array 110, a control logic circuit 120, a voltage generator 130, a row decoder 140, and a page buffer 150. However, configuration of the memory device 100 is not limited to that shown in FIG. 1 and may further include other elements, such as a data input/output (I/O) unit.

The memory cell array 110 may include a plurality of memory cells and be connected to word lines WL and bit lines BL. For example, the memory cell array 110 may be connected to the row decoder 140 through the word lines WL, string selection lines SSL, and ground selection lines GSL and connected to the page buffer 150 through the bit lines BL. Each of the memory cells may store at least one bit. For example, each of the memory cells may be used as a single-level cell, a multi-level cell, or a triple-level cell. The memory cell array 110 may include a plurality of memory blocks BLK1 to BLKz. In an exemplary embodiment of the inventive concept, some of the plurality of memory blocks BLK1 to BLKz may be single-level cell blocks, while the rest of the plurality of memory blocks BLK1 to BLKz may be multi-level cell blocks or triple-level cell blocks.

In the present exemplary embodiment, the plurality of memory cells in the memory cell array 110 may be flash memory cells. Hereinafter, exemplary embodiments will be described in detail on the assumption that the plurality of memory cells are NAND flash memory cells. However, the inventive concept is not limited thereto. For example, according to an exemplary embodiment of the inventive concept, the plurality of memory cells may be resistive memory cells, such as resistive RAM (ReRAM) cells, phase-change RAM (PRAM) cells, or magnetic RAM (MRAM) cells.

According to an exemplary embodiment of the inventive concept, the memory cell array 110 may include a two-dimensional (2D) memory cell array, which may include a plurality of cell strings arranged in rows and columns. According to an exemplary embodiment of the inventive concept, the memory cell array 110 may include a three-dimensional (3D) memory cell array, which may include a plurality of NAND strings. Each of the plurality of NAND strings may include memory cells, which are connected to word lines vertically stacked on a substrate. The configuration of the memory cell array 110 will be described below with reference to FIGS. 2 and 3.

The 3D memory cell array may be monolithically formed of one or more physical levels of memory cell arrays having an active area and circuitry associated with operation of the memory cells. The active area may be provided above a silicon substrate, and the circuitry may be provided above or within the silicon substrate. The term "monolithically formed" may mean that layers of each level are directly deposited on the layer of its directly underlying level; in other words, the layers are stacked on top of each other.

In an exemplary embodiment of the inventive concept, the 3D memory cell array may include NAND strings in which at least one memory cell is located on top of another memory cell in a vertical direction. The at least one memory cell may include a charge trap layer. The following patent documents, which are hereby incorporated by reference in their entireties, disclose configurations for 3D memory arrays, in which a 3D memory array has a plurality of levels, with word lines and/or bit lines shared between levels: U.S. Pat. Nos. 7,679,133; 8,553,466; 8,654,587; 8,559,235; and U.S. Pat. Pub. No. 2011/0233648.

Figure 2:
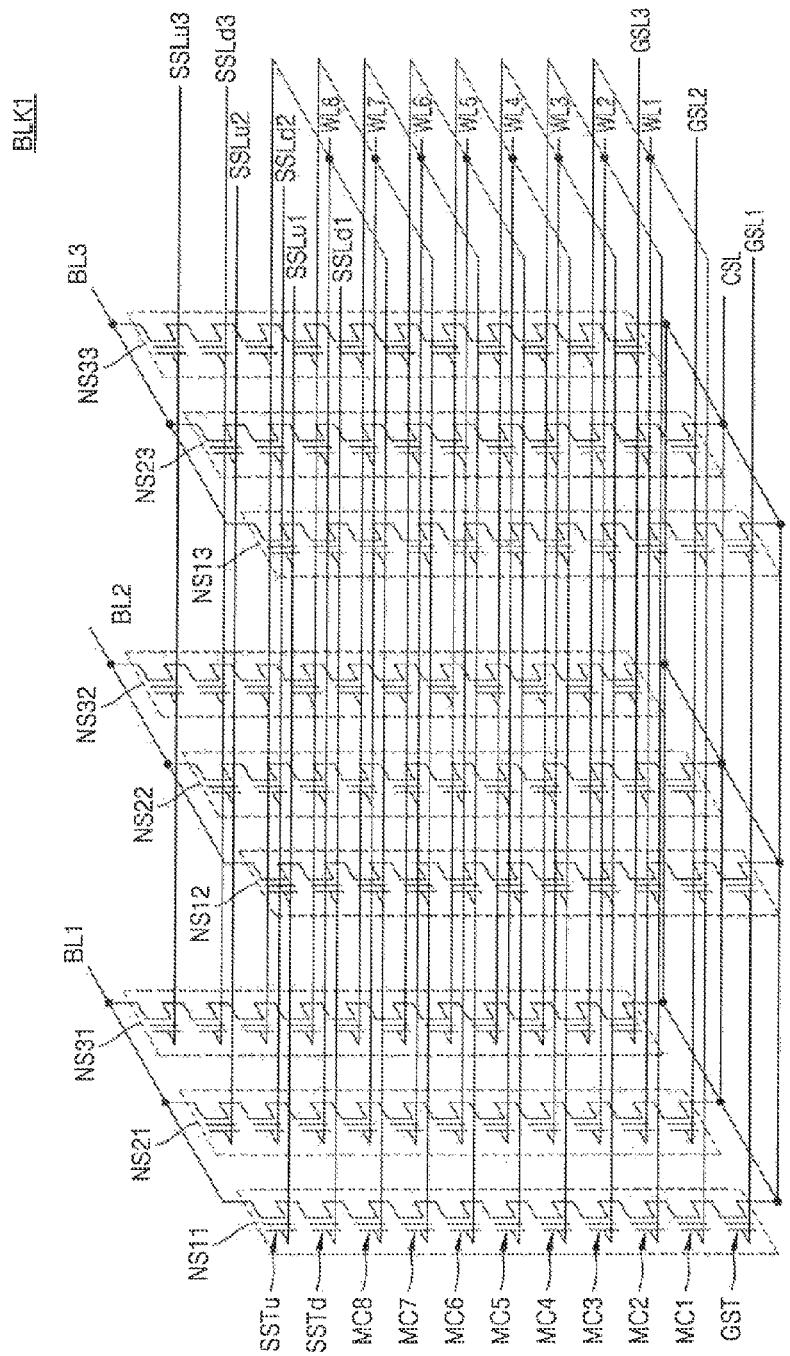
FIG. 2 is a circuit diagram a memory block included in a memory cell array of FIG. 1, according to an exemplary embodiment of the inventive concept.

FIG. 2 is a circuit diagram illustrating an example of the memory block BLK1 included in the memory cell array 110 of FIG. 1.

Referring to FIG. 2, the memory cell array 110 may be a memory cell array of vertical NAND (VNAND) flash memories and include a plurality of memory blocks. The memory block BLK1 may include a plurality of NAND strings NS11 to NS33, a plurality of word lines WL1 to WL8, a plurality of bit lines BL1 to BL3, a plurality of ground selection lines GSL1 to GSL3, a plurality of upper string selection lines SSLu1 to SSLu3, a plurality of lower string selection lines SSLd1 to SSLd3, and a common source line CSL. Here, the number of NAND strings, the number of word lines, the number of bit lines, the number of ground selection lines, the number of upper string selection lines, and the number of lower string selection lines may vary according to exemplary embodiments of the inventive concept.

NAND strings NS11, NS21, and NS31 may be provided between a first bit line BL1 and the common source line CSL, NAND strings NS12, NS22, and NS32 may be provided between a second bit line BL2 and the common source line CSL, and NAND strings NS13, NS23, and NS33 may be provided between a third bit line BL3 and the common source line CSL. Each NAND string (e.g., NS11) may include an upper string select transistor SSTu, a lower string select transistor SSTd, a plurality of memory cells MC1 to MC8, and a ground select transistor GST, which are connected in series. Hereinafter, a NAND string will be referred to as a string for brevity.

Strings connected in common to one bit line may constitute one column. For example, strings NS11, NS21, and NS31 connected in common to the first bit line BL1 may correspond to a first column, strings NS12, NS22, and NS32 connected in common to the second bit line BL2 may correspond to a second column, and strings NS13, NS23, and NS33 connected in common to the third bit line BL3 may correspond to a third column.

Strings connected in common to one string selection line may constitute one row. For example, strings NS11, NS12, and NS13 connected to a first upper string selection line SSLu1 may correspond to a first row, strings NS21, NS22, and NS23 connected to a second upper string selection line SSLu2 may correspond to a second row, and strings NS31, NS32, and NS33 connected to a third upper string selection line SSLu3 may correspond to a third row.

The upper string select transistor SSTu of each string may be connected to one of the upper string selection lines SSLu1 to SSLu3 corresponding to the respective string, and the lower string select transistor SSTd of each string may be connected to one of the lower string selection lines SSLd1 to SSLd3 corresponding to the respective string. The plurality of memory cells MC1 to MC8 of each string may be connected to the word lines WL1 to WL8, respectively. The ground select transistor GST of each string may be connected to one of the ground selection lines GSL1 to GSL3 corresponding to the respective string. The upper string select transistor SSTu of each string may be connected to one the bit lines BL1 to BL3 corresponding to the respective string, and the ground select transistor GST of each string may be connected to the common source line CSL.

In the present exemplary embodiment of the inventive concept, word lines (e.g., WL1) located at the same level may be connected in common to one another, the upper string selection lines SSLu1 to SSLu3 may be separate from one another, the lower string selection lines SSLd1 to SSLd3 may be separate from one another, and the ground selection lines GSL1 to GSL3 may be separate from one another. For example, when memory cells connected to the first word line WL1 and included in the strings NS11, NS12, and NS13 are programmed, the first word line WL1, the first upper string selection line SSLu1, and the first lower string selection line SSLd1 may be selected. However, the inventive concept is not limited thereto. For example, in an exemplary embodiment of the inventive concept, the ground selection lines GSL1 to GSL3 may be connected in common to one another.

Figure 3:
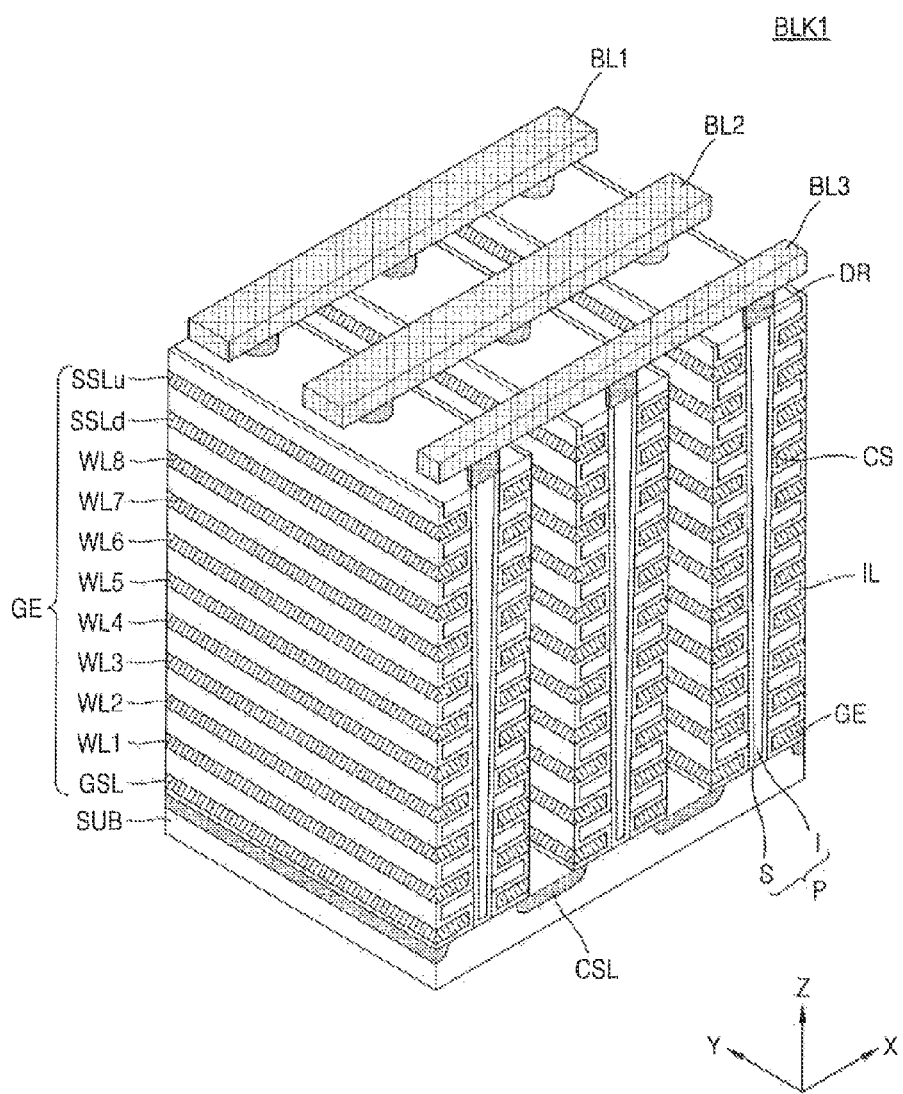
FIG. 3 is a perspective view of the memory block of FIG. 2.

FIG. 3 is a perspective view of the memory block BLK1 of FIG. 2.

Referring to FIG. 3, each of the plurality of memory blocks BLK1 to BLKz included in the memory cell array 110 may be formed in a vertical direction with respect to a substrate SUB. FIG. 3 illustrates a case in which the memory block BLK1 includes three selection lines GSL, SSLu, and SSLd, eight word lines WL1 to WL8, and three bit lines BL1 to BL3. However, the number of selection lines, the number of word lines, and the number of bit lines may be actually larger or smaller than that shown in FIG. 3 according to exemplary embodiments of the inventive concept.

The substrate SUB may be of a first conductivity type (e.g., p type), and a common source line CSL may be provided on the substrate SUB. The common source line CSL may extend in a first direction (e.g., Y direction) and be doped with impurities of a second conductivity type (e.g., n type). A plurality of insulating layers IL may extend in the first direction and be sequentially provided in a third direction (e.g., Z direction) within a region of the substrate SUB that is between two adjacent common source lines CSL. In addition, the plurality of insulating layers IL may be spaced apart from one another in the third direction. For example, the plurality of insulating layers IL may include an insulating material, such as silicon oxide.

A plurality of pillars P may be sequentially provided in the first direction on a region of the substrate SUB between two adjacent common source lines CSL. Each of the plurality of pillars may penetrate the plurality of insulating layers IL in the third direction. For example, the plurality of pillars P may penetrate the plurality of insulating layers IL and contact the substrate SUB. For example, a surface layer S of each of the plurality of pillars P may include a silicon material of the first conductivity type and function as a channel region. In addition, an inner layer I of each of the pillars P may include an insulating material, such as silicon oxide or an air gap.

A charge storage layer CS may be provided within a region between two adjacent common source lines CSL along exposed surfaces of the insulating layers IL, the pillars P, and the substrate SUB. The charge storage layer CS may include a gate insulating layer (or a 'tunneling insulating layer'), a charge trap layer, and a blocking insulating layer. For example, the charge storage layer CS may include an oxide-nitride-oxide (ONO) structure. In addition, a gate electrode GE, including the selection lines GSL, SSLu, and SSLd and the word lines WL1 to WL8, may be provided within a region between two adjacent common source lines CSL on exposed surfaces of the charge storage layer CS.

Drains or drain contacts DR may be provided on the plurality of pillars P. The drains or drain contacts DR may include a silicon material doped with impurities of the second conductivity type. Bit lines BL1 to BL3 may be provided on the drains DR. The bit lines BL1 to BL3 may extend in a second direction (e.g., X direction) and be spaced apart from one another in the first direction.

Referring back to FIG. 1, the control logic circuit 120 may output various control signals for writing data to the memory cell array 110, reading data from the memory cell array 110, or erasing data stored in the memory cell array 110 based on a command CMD, an address ADDR, and a control signal CTRL received from the outside (e.g., a memory controller). Thus, the control logic circuit 120 may control various operations of the memory device 100.

In the present exemplary embodiment, the control logic circuit 120 may include a bad block checking unit 125. The bad block checking unit 125 may perform a check operation on a threshold voltage of each of select transistors (e.g., the upper string select transistor SSTu, the lower string select transistor SSTd, and the ground select transistor GST of FIG. 2) included in at least one of the plurality of NAND strings, and may process a memory block, which includes some NAND strings, as a bad block based on a result of the check operation. Hereinafter, an operation of the bad block checking unit 125 will be described with reference to FIGS. 1 to 3.

The bad block checking unit 125 may perform the check operation on the threshold voltage of each of select transistors (e.g., the upper string select transistor SSTu, the lower string select transistor SSTd, and the ground select transistor GST) included in the first NAND string NS11. For example, the bad block checking unit 125 may perform the check operation to check whether the threshold voltage of each of the select transistors is within a reference voltage range. Here, the reference voltage range may be between a lower-limit reference voltage level and an upper-limit reference voltage level and the reference voltage range may be determined differently based on the select transistor. For example, certain select transistors may be checked against a first reference voltage range whereas others may be checked against a second reference voltage range different from the first reference voltage range.

Thereafter, if the threshold voltage of each of the select transistors included in the first NAND string NS11 is within the reference voltage range, the bad block checking unit 125 may perform a check operation to check whether a threshold voltage of each of select transistors included in the second NAND string NS21, which is the next NAND string, is within a reference voltage range. If the threshold voltage of at least one of the select transistors included in the first NAND string NS11 is not within the reference voltage range, the bad block checking unit 125 may process the memory block BLK1, which includes the first NAND string NS11, as a bad block.

In the present exemplary embodiment, the bad block checking unit 125 may variously determine the order of check operations on the threshold voltages of the select transistors included in the first NAND string NS11. For example, out of the plurality of select transistors included in the first NAND string NS11, the bad block checking unit 125 may perform the check operation on the upper string select transistor SSTu, then the lower string select transistor SSTd, and finally the ground select transistor GST.

According to the present exemplary embodiment, the bad block checking unit 125 may selectively determine whether the check operation is to be performed on the threshold voltage of each of the select transistors included in the first NAND string NS11. For example, out of the plurality of select transistors included in the first NAND string NS11, the bad block checking unit 125 may only perform check operations on the threshold voltages of the lower string select transistor SSTd and the ground select transistor GST, but may not perform a check operation on the threshold voltage of the upper string select transistor SSTd. In this case, the bad block checking unit 125 may perform the check operation on the threshold voltage of the lower string select transistor SSTd and then perform the check operation on the threshold voltage of the ground select transistor GST.

For example, as part of the check operation on the threshold voltage of the lower string select transistor SSTd, the bad block checking unit 125 may perform a first check operation by comparing the threshold voltage of the lower string select transistor SSTd with a first lower-limit reference voltage level. In this case, the first check operation may be referred to as an under check operation. If the threshold voltage is equal to or higher than the first lower-limit reference voltage level, the check operation on the threshold voltage of the lower string select transistor SSTd may be ended, and the bad block checking unit 125 may then perform a first check operation on the threshold voltage of the ground select transistor GST.

If the threshold voltage of the lower string select transistor SSTd is lower than the first lower-limit reference voltage level, the bad block checking unit 125 may perform a program operation on the lower string select transistor SSTd. In this case, a program voltage applied to the lower string selection line SSLd may be lower than a program voltage to be applied to the memory cells. This program operation may be referred to as a soft program operation. Thus, the threshold voltage of the lower string select transistor SSTd may increase. Thereafter, the bad block checking unit 125 may perform a second check operation on the threshold voltage of the lower string select transistor SSTd. For example, the bad block checking unit 125 may compare the threshold voltage of the lower string select transistor SSTd with a first upper-limit reference voltage level. In this case, the second check operation may be referred to as an upper check operation.

The voltage generator 130 may generate various kinds of voltages for performing a program operation, a read operation, and an erase operation on the memory cell array 110, based on a voltage control signal CTRL_vol. For example, the voltage generator 130 may generate a word line driving voltage VWL for driving the word lines WL, e.g., a program voltage (or a write voltage), a read voltage, a program inhibition voltage, a read inhibition voltage, an erase verification voltage, or a program verification voltage. In addition, the voltage generator 130 may further generate an upper string selection line driving voltage for driving the upper string selection lines SSLu, a lower string selection line driving voltage for driving the lower string selection lines SSLd, and a ground selection line driving voltage for driving the ground selection lines GSL. Moreover, the voltage generator 130 may further generate an erase voltage to be provided to the memory cell array 110.

In the present exemplary embodiment, the voltage generator 130 may generate lower-limit reference voltage levels for performing under check operations on the upper string select transistor SSTu, the lower string select transistor SSTd, and the ground select transistor GST. In addition, the voltage generator 130 may generate upper-limit reference voltage levels for performing upper check operations on the upper string select transistor SSTu, the lower string select transistor SSTd, and the ground select transistor GST. Furthermore, the voltage generator 130 may generate program voltage levels for performing program operations on the upper string select transistor SSTu, the lower string select transistor SSTd, and the ground select transistor GST.

The row decoder 140 may select some word lines out of the word lines WL in response to a row address X-ADDR received from the control logic circuit 120. For example, during a read operation, the row decoder 140 may apply a read voltage to the selected word lines and apply a read inhibition voltage to the unselected word lines. In addition, during a program operation, the row decoder 140 may apply a program voltage to the selected word lines and apply a program inhibition voltage to the unselected word lines. Furthermore, the row decoder 140 may select some string selection lines out of the string selection lines SSL or some ground selection lines out of the ground selection lines GSL, in response to the row address X-ADDR received from the control logic circuit 120.

For example, while the under check operation or the upper check operation is performed on the upper string select transistor SSTu, the row decoder 140 may apply a voltage corresponding to the lower-limit reference voltage level or the upper-limit reference voltage level to the upper string selection line SSLu, and apply a turn-on voltage to the lower string selection line SSLd, the word lines WL, and the ground selection line GSL. The turn-on voltage has a voltage level capable of turning on transistors connected to the lower string selection line SSLd, the word lines WL, and the ground select line GSL.

As another example, while the program operation is performed on the upper string select transistor SSTu, the row decoder 140 may apply a program voltage to the upper string selection line SSLu, and apply a program inhibition voltage to the lower string selection line SSLd, the word lines WL, and the ground selection line GSL. In this case, the program voltage applied to the upper string selection line SSLu may be lower than a program voltage to be applied to the memory cells.

The page buffer 150 may be connected to the memory cell array 110 through the bit lines BL and select some bit lines out of the bit lines BL in response to a column address Y-ADDR received from the control logic circuit 120. For example, during a read operation, the page buffer 150 may operate as a sense amplifier and sense data DATA stored in the memory cell array 110. In addition, during a program operation, the page buffer 150 may operate as a write driver and input data DATA to be stored in the memory cell array 110.

FIGS. 4A to 4D are circuit diagrams of examples of a column included in a memory block, according to exemplary embodiments of the inventive concept.

With reference to FIGS. 4A to 4D, each of columns 41 to 44 may include a plurality of NAND strings connected to a bit line BL1. In this case, the bit line BL1 may correspond to the bit line BL1 of the memory block BLK1 of FIG. 2, and a plurality of NAND strings included in the columns 41 to 44 may correspond to NAND strings NS11, NS21, and NS31 connected to the bit line BL1 of FIG. 2.

Figure 4A:
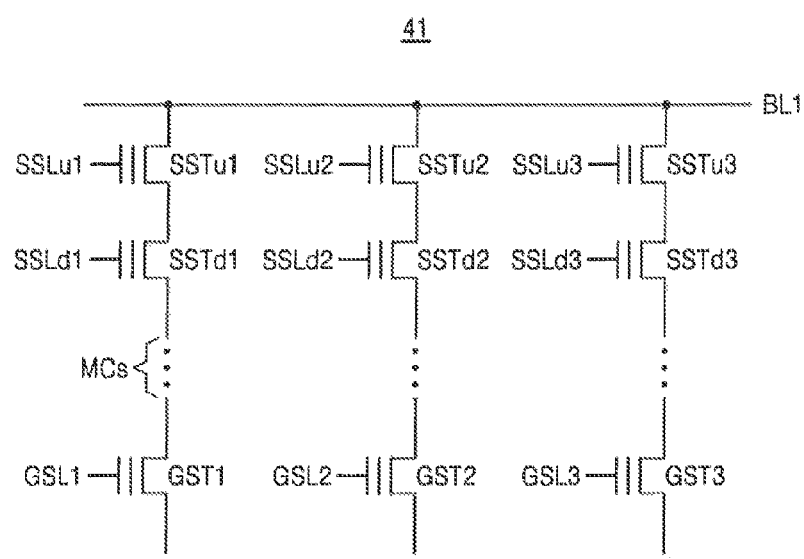
FIGS. 4A to 4D are circuit diagrams of a column included in a memory block, according to exemplary embodiments of the inventive concept.

Referring to FIG. 4A, each of the NAND strings included in a column 41 may include a plurality of memory cells MCs and a plurality of select transistors. For example, the plurality of select transistors may include an upper string select transistor SSTu1, a lower string select transistor SSTd1, and a ground select transistor GST1. In this case, like the memory cells MC, each of the upper string select transistor SSTu1, the lower string select transistor SSTd1, and the ground select transistor GST1 may be a cell-type transistor including a charge storage layer. Accordingly, a program operation for increasing threshold voltages of the upper string select transistor SSTu1, the lower string select transistor SSTd1, and the ground select transistor GST1 may be performed.

Figure 4B:
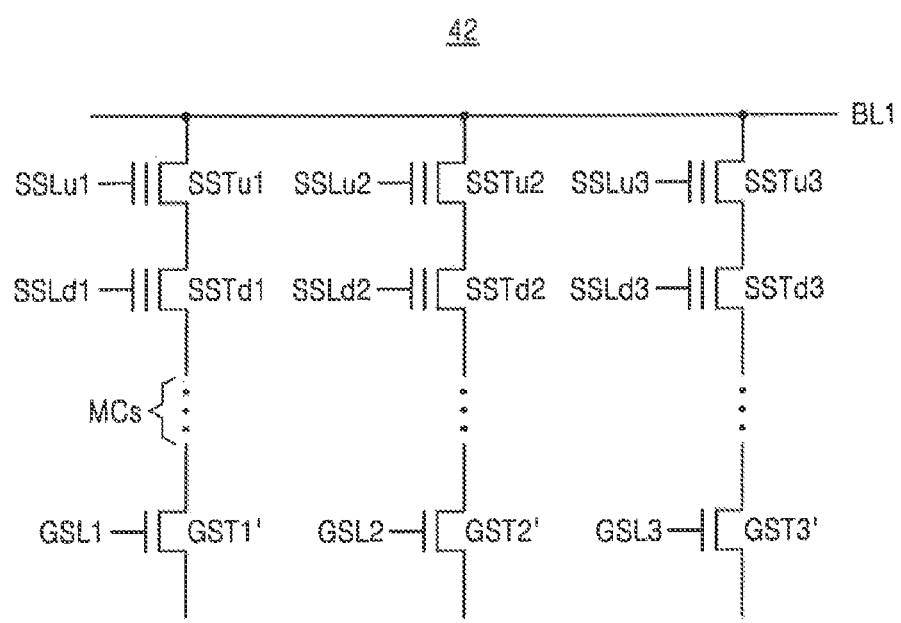

Referring to FIG. 4B, each of the NAND strings included in a column 42 may include a plurality of memory cells MCs and a plurality of select transistors. For example, the plurality of select transistors may include an upper string select transistor SSTu1, a lower string select transistor SSTd1, and a ground select transistor GST1'. In this case, like the memory cells MCs, each of the upper string select transistor SSTu1 and the lower string select transistor SSTd1 may be a cell-type transistor including a charge storage layer. Thus, a program operation for increasing threshold voltages of the upper string select transistor SSTu1 and the lower string select transistor SSTd1 may be performed. In addition, the ground select transistor GST1' may be a normal transistor that does not include an electron storage layer. Accordingly, a program operation may not be performed on the ground select transistor GST1'.

Figure 4C:
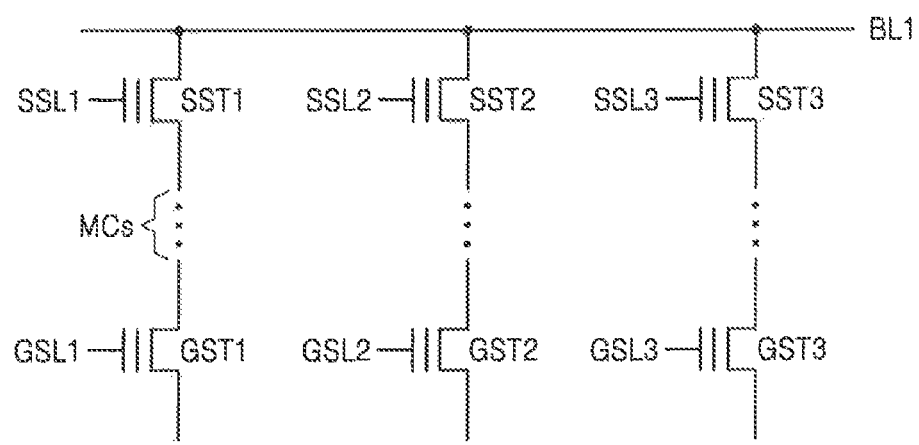

Referring to FIG. 4C, each of the NAND strings included in a column 43 may include a plurality of memory cells MCs and a plurality of select transistors. For example, the plurality of select transistors may include a string select transistor SST1 and a ground select transistor GST1. In this case, like the memory cells MCs, each of the string select transistor SST1 and the ground select transistor GST1 may be a cell-type transistor including a charge storage layer. Accordingly, a program operation for increasing threshold voltages of the string select transistor SST1 and the ground select transistor GST1 may be performed.

Figure 4D:
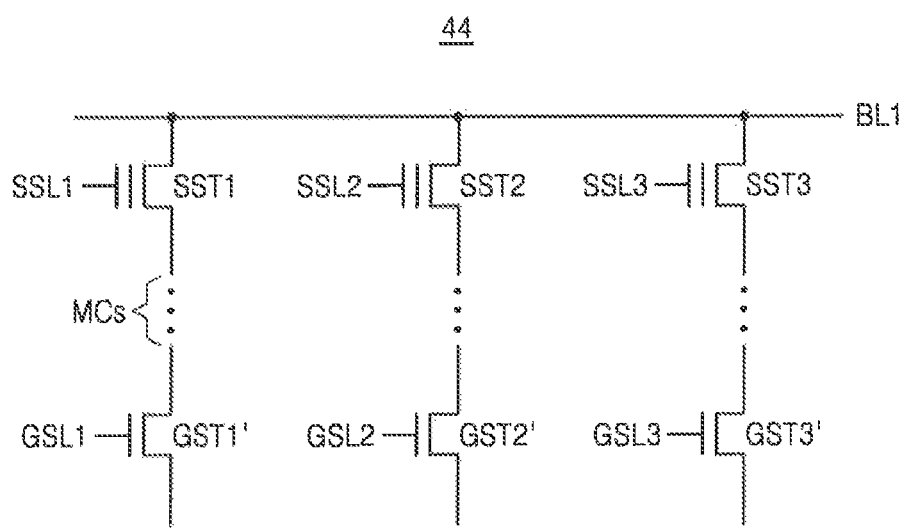

Referring to FIG. 4D, each of the NAND strings included in a column 44 may include a plurality of memory cells MCs and a plurality of select transistors. For example, the plurality of select transistors may include a string select transistor SST1 and a ground select transistor GST1'. In this case, like the memory cells MCs, the string select transistor SST1 may be a cell-type transistor including a charge storage layer. Thus, a program operation for increasing a threshold voltage of the string select transistor SST1 may be performed. In addition, the ground select transistor GST1' may be a normal transistor that does not include an electron storage layer. Accordingly, a program operation may not be performed on the ground select transistor GST1'.

The columns 41 to 44 described with reference to FIGS. 4A to 4D are only examples. The number and types (e.g., whether a charge storage layer is included) of select transistors included in each NAND string may be variously changed according to exemplary embodiments of the inventive concept.

Figure 5:
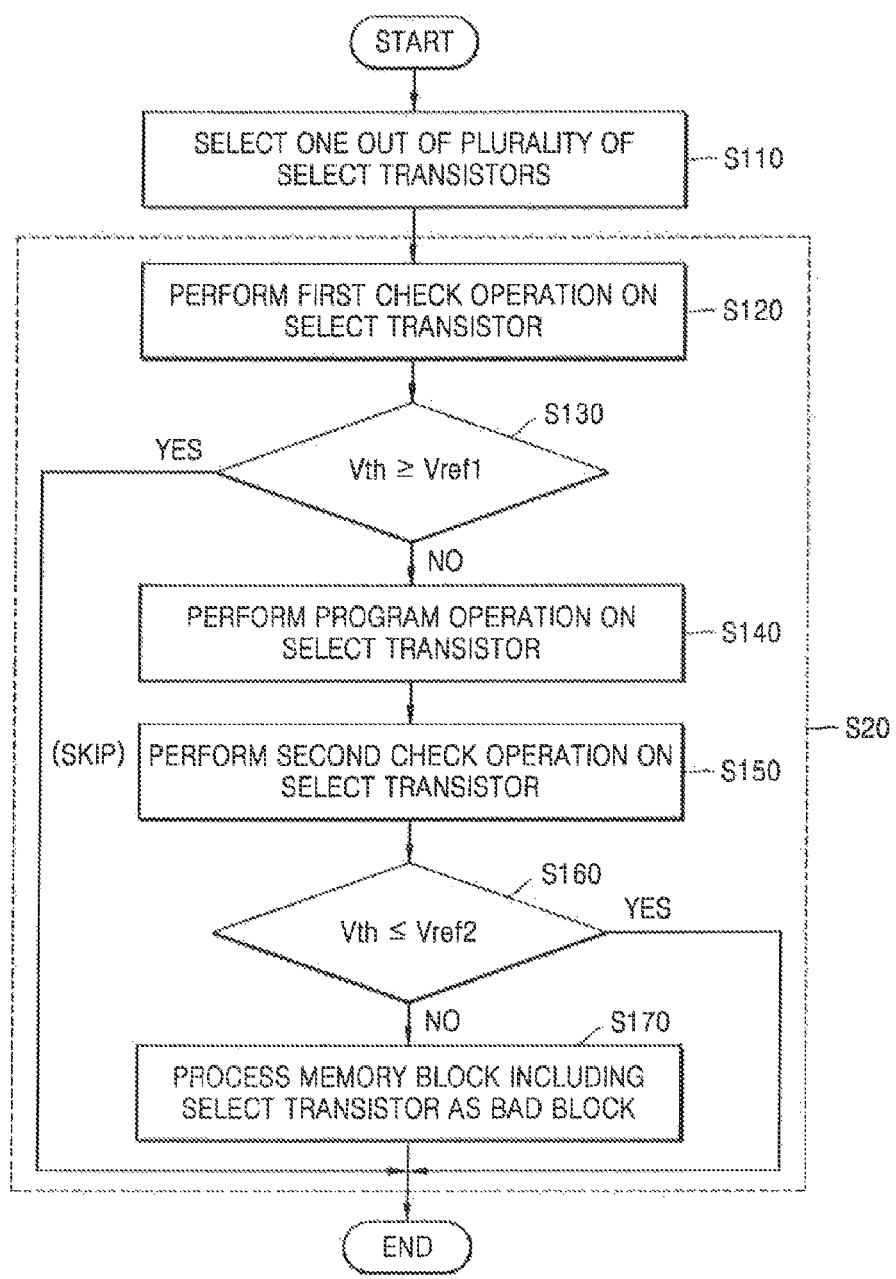
FIG. 5 is a flowchart of a method of operating a memory device according to an exemplary embodiment of the inventive concept.
Figure 6A:
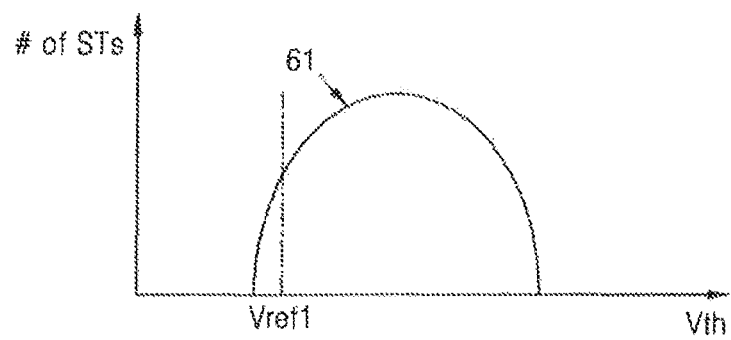
FIGS. 6A to 6C are graphs of distributions of select transistors relative to threshold voltages, which illustrate the method of FIG. 5.
Figure 6B:
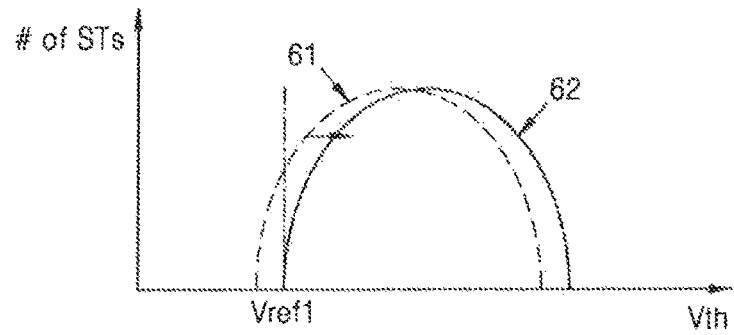
Figure 6C:
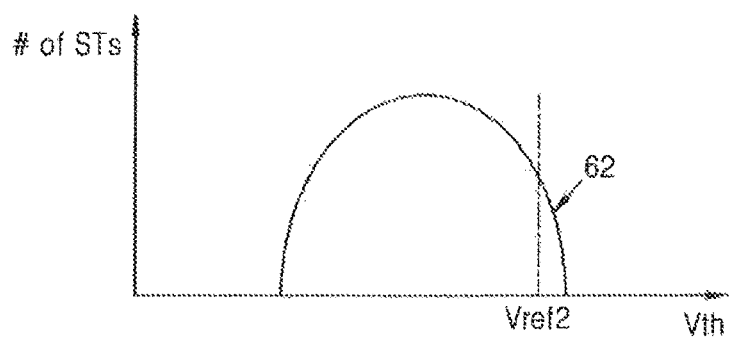

FIG. 5 is a flowchart of a method of operating a memory device according to an exemplary embodiment of the inventive concept. FIGS. 6A to 6C are graphs showing distributions of select transistors relative to threshold voltages, which illustrate the method of FIG. 5.

Referring to FIG. 5, the method of operating the memory device may be a method of performing a bad block check operation with respect to memory blocks included in the memory device. For example, the method of operating the memory device according to the present exemplary embodiment may include operations performed in a temporal sequence by the memory device 100 of FIG. 1. The descriptions presented with reference to FIGS. 1 to 4 may be applied to the method illustrated in FIG. 5, and repeat descriptions will be omitted.

In operation S110, a first select transistor from a plurality of select transistors may be selected. For example, the bad block checking unit 125 of the control logic circuit 120 may select the first select transistor out of the plurality of select transistors include in a NAND string. In operation S20, a check operation may be performed on a threshold voltage of the first select transistor that is selected in operation S110. After operation S20, an operation of selecting a second select transistor from the plurality of select transistors and a check operation on a threshold voltage of the second select transistor may be performed. Operation S20 may include operations S120 to S170 and will be described below.

In operation S120, a first check operation may be performed on the first select transistor. Here, the first check operation may be an under check operation to compare a threshold voltage Vth of the first select transistor with a lower-limit reference voltage level Vref1. The under check operation may also be referred as a lower check operation. For example, the control logic circuit 120 may control the voltage generator 130, the row decoder 150, and the page buffer 150 so that the lower-limit reference voltage level Vref1 may be applied to a selection line connected to the first select transistor. In addition, after the lower-limit reference voltage level Vref1 is applied, the control logic circuit 120 may control the page buffer 150 to detect a voltage level of a bit line connected to the first select transistor.

In operation S130, it may be determined whether or not the threshold voltage Vth of the first select transistor is equal to or higher than the lower-limit reference voltage level Vref1. For example, a curve 61 shown in FIG. 6A indicates a distribution of select transistors relative to a threshold voltage Vth, which corresponds to operation S130. When the lower-limit reference voltage level Vref1 is applied to a selection line connected to a select transistor, if the threshold voltage Vth of the select transistor is below the lower-limit reference voltage level Vref1, the select transistor may be turned off. If the threshold voltage Vth of the select transistor is equal to or higher than the lower-limit reference voltage level Vref1, the select transistor may be turned on.

If the threshold voltage Vth of the first select transistor is determined as below the lower-limit reference voltage level Vref1, it may be determined that the first select transistor has failed the first check operation, and operations S140 to S170 may be performed. If the threshold voltage Vth of the first select transistor is determined as equal to or higher than the lower-limit reference voltage level Vref1, it may be determined that the first select transistor has passed the first check operation, and operations S140 to S170 may be skipped.

In operation S140, a program operation may be performed on the first select transistor. For example, the control logic circuit 120 may control the voltage generator 130, the row decoder 140, and the page buffer 150 so that a program voltage may be applied to the selection line connected to the first select transistor. In this case, the program voltage applied to the selection line connected to the first select transistor may be lower than a program voltage to be applied to the memory cells.

For example, when the threshold voltage Vth of the first select transistor is below the lower-limit reference voltage level Vref1, the program operation may be performed on the first select transistor so that the threshold voltage Vth of the first select transistor is equal to or higher than the lower-limit reference voltage level Vref1. For example, a curve 62 shown in FIG. 6B indicates a distribution of select transistors relative to a threshold voltage Vth after the program operation. The distribution of select transistors relative to the threshold voltage Vth may be shifted in a positive direction due to the program operation.

In operation S150, a second check operation may be performed on the first select transistor. Here, the second check operation may be an upper check operation of comparing the threshold voltage Vth of the first select transistor with an upper-limit reference voltage level Vref2. For example, the control logic circuit 120 may control the voltage generator 130, the row decoder 140, and the page buffer 150 so that the upper-limit reference voltage level Vref2 may be applied to a selection line connected to the first select transistor. After the upper-limit reference voltage level Vref2 is applied, the control logic circuit 120 may control the page buffer 150 to detect a voltage level of a bit line connected to the first select transistor.

The threshold voltage Vth of the first select transistor may increase due to the program operation of operation S140. Thus, in operation S150, the upper check operation on the first select transistor checks whether the threshold voltage Vth is equal to or higher than the upper-limit reference voltage level Vref2. Thus, the upper check operation may prevent the first select transistor from failing as a result of the program operation on the first select transistor.

In operation S160, it may be determined whether the threshold voltage Vth of the first select transistor is lower than the upper-limit reference voltage level Vref2. For example, a curve 62 shown in FIG. 6C indicates a distribution of select transistors relative to a threshold voltage Vth, which corresponds to operation S160. When the upper-limit reference voltage level Vref2 is applied to the selection line connected to the select transistor, if the threshold voltage Vth of the select transistor is lower than the upper-limit reference voltage level Vref2, the select transistor may be turned off. If the threshold voltage Vth of the select transistor is equal to or higher than the upper-limit reference voltage level Vref2, the select transistor may be turned on.

Referring back to FIG. 5, if the threshold voltage Vth of the first select transistor is determined as higher than the upper-limit reference voltage level Vref2, it may be determined that the first select transistor has failed the second check operation, and operation S170 may be performed. If the threshold voltage Vth of the first select transistor is equal to or lower than the upper-limit reference voltage level Vref2, it may be determined that the select transistor has passed the second check operation, and operation S170 may be skipped.

In operation S170, a memory block including the first select transistor may be processed as a bad block. For example, if the threshold voltage Vth of the first select transistor is higher than the upper-limit reference voltage level Vref2, the bad block checking unit 125 may determine the NAND string as a failed string and process a memory block including the corresponding NAND string as a bad block. However, the inventive concept is not limited thereto. In an exemplary embodiment of the inventive concept, if the threshold voltage Vth of the first select transistor is higher than the upper-limit threshold voltage level Vref2, the bad block checking unit 125 may process the NAND string as a bad string and continue to perform check operations on other NAND strings of the memory block.

Therefore, according to the present exemplary embodiment, it may be selectively determined whether subsequent operations are to be performed, based on the result of the first check operation on the first select transistor. For example, when the first check operation is passed successfully, it may be determined that subsequent operations are not to be performed. Accordingly, the time taken to perform check operations may be reduced. Thus, the time taken for the bad block check operation may be reduced. Additionally, the method of operating the memory device according to the present exemplary embodiment may be performed during an erase period of the memory block. Furthermore, check operations may be performed after an operation of erasing memory cells. In this case, the time taken for the erase period of the memory block may be reduced.

Figure 7:
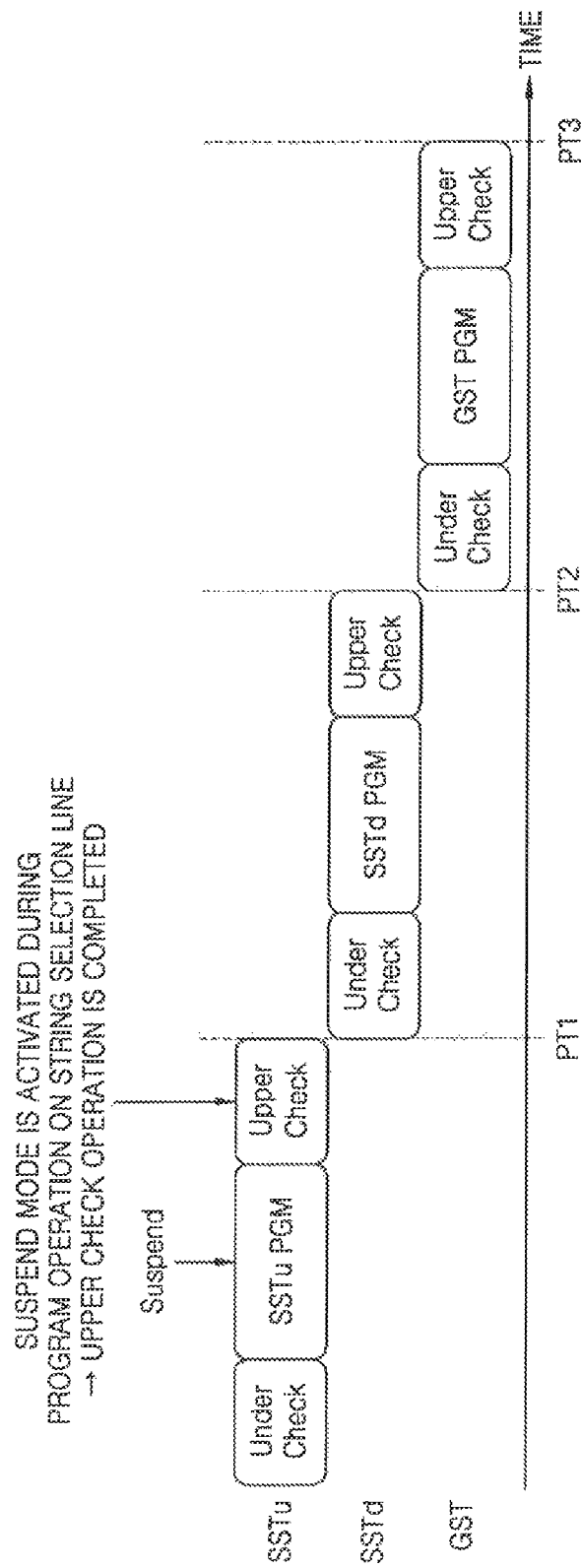
FIG. 7 is a diagram of an operation of checking select transistors according to an exemplary embodiment of the inventive concept.

FIG. 7 is a diagram of an operation of checking select transistors according to an exemplary embodiment of the inventive concept.

Referring to FIG. 7, in the present exemplary embodiment, the order of checking the select transistors may be determined such that an upper string select transistor SSTu, a lower string select transistor SSTd, and a ground select transistor GST are checked in an orderly fashion. For example, a check operation may be performed on a threshold voltage of the upper string select transistor SSTu, then a check operation may be then performed on a threshold voltage of the lower string select transistor SSTd, and finally a check operation may be performed on a threshold voltage of the ground select transistor GST.

To begin with, the check operation may be performed on the upper string select transistor SSTu. An under check operation may be performed on the threshold voltage of the upper string select transistor SSTu. If the upper string select transistor SSTu fails the under check operation, the program operation (SSTu PGM) may be performed on the upper string select transistor SSTu. According to the present exemplary embodiment, directly after the program operation is performed on the upper string select transistor SSTu, an upper check operation may be performed on the threshold voltage of the upper string select transistor SSTu. In addition, according to the present exemplary embodiment, even if a suspend mode is activated during the program operation on the upper string select transistor SSTu, the check operation may be ended only after the upper check operation is completed. Accordingly, the check operation may be resumed at a first point PT1.

Thereafter, the check operation may be performed on the lower string select transistor SSTd. An under check operation may be performed on the threshold voltage of the lower string select transistor SSTd. If the lower string select transistor SSTd fails the under check operation, the program operation (SSTd PGM) may be performed on the lower string select transistor SSTd. According to the present exemplary embodiment, directly after the program operation is performed on the lower string select transistor SSTd, an upper check operation may be performed on the threshold voltage of the lower string select transistor SSTd. In addition, according to the present exemplary embodiment, even if a suspend mode is activated during the program operation on the lower string select transistor SSTd, the check operation may be ended only after the upper check operation is completed. Accordingly, the check operation may be resumed at a second point PT2.

Finally, the check operation may be performed on the ground select transistor GST. An under check operation may be performed on the threshold voltage of the ground select transistor GST. If the ground select transistor GST fails the under check operation, the program operation (GST PGM) may be performed on the ground select transistor GST. According to the present exemplary embodiment, directly after the program operation is performed on the ground select transistor GST, an upper check operation may be performed on the threshold voltage of the ground select transistor GST. In addition, according to the present exemplary embodiment, even if a suspend mode is activated during the program operation on the ground select transistor GST, the check operation may be ended only after the upper check operation is completed. Accordingly, the check operation may be resumed at a third point PT3.

In general, a program operation may be performed based on a result of an under check operation of a threshold voltage of each of the select transistors, and under check operations and program operations may be completely performed on all select transistors included in the NAND string. Thereafter, an upper check operation may be performed on the threshold voltage of each of the select transistors. When a check operation on the select transistors is performed in a memory device by using an on-chip operation, a memory controller may not be able to detect the status of the check operation. Thus, a suspend mode with respect to the memory device may be activated during the check operation. In this case, when the check operation is resumed (e.g., for a subsequent select transistor), the status of the previous check operation (e.g., whether or not a program operation is performed) may not be detected before the check operation is resumed.

For example, in the general case, when a suspend mode is activated during the check operations on the upper string select transistor SSTu, the lower string select transistor SSTd, and the ground select transistor GST, time points at which the check operations may be resumed may be a time point after a program operation on the upper string select transistor SSTu, a time point after a program operation on the lower string select transistor SSTd, a time point after a program operation on the ground select transistor GST, and a time point after under check operations on the upper string select transistor SST, the lower string select transistor SSTd, and the ground select transistor GST. Accordingly, the check operations may be resumed at four time points.

However, according to the present exemplary embodiment, an upper check operation may be performed directly after a program operation is performed on each of the select transistors. Accordingly, the check operations may be resumed at three time points (e.g., first to third points PT1 to PT3), which are smaller in number than in the general case. As a result, the complexity of check operations on threshold voltages of select transistors may be reduced. In addition, even if a suspend mode is activated during check operations, the check operations may be resumed rapidly and continued.

Figure 8:
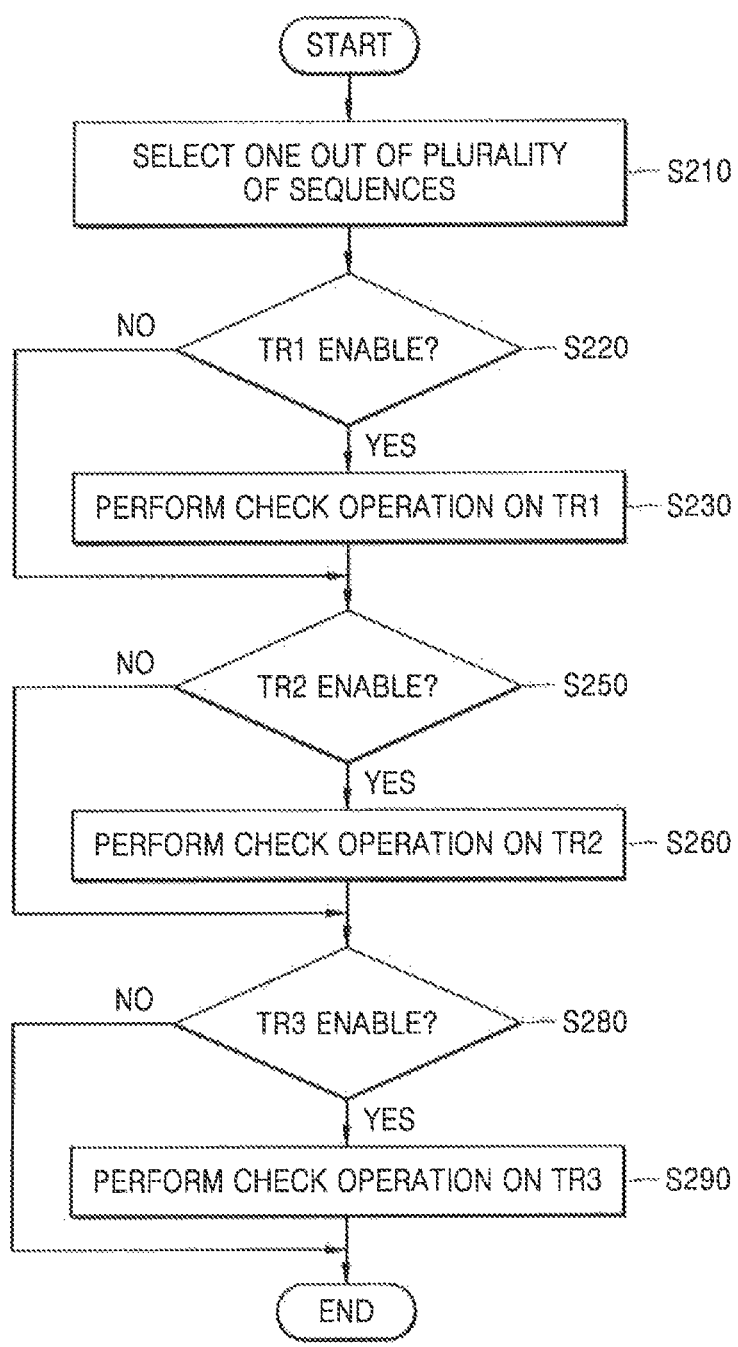
FIG. 8 is a flowchart of a method of operating a memory device according to an exemplary embodiment of the inventive concept.

FIG. 8 is a flowchart of a method of operating a memory device according to an exemplary embodiment of the inventive concept.

Referring to FIG. 8, the method of operating the memory device may be a method of performing a bad block check operation with respect to memory blocks included in the memory device. The method may include operations performed in a temporal sequence by the memory device 100 of FIG. 1. Accordingly, the method of operating the memory device according to the present exemplary embodiment may be referred to as an on-chip check method. The descriptions presented with reference to FIGS. 1 to 4 may be applied to the method illustrated in FIG. 8, and repeat descriptions will be omitted.

In operation S210, one sequence may be selected out of a plurality of sequences that may be predefined. For example, the bad block checking unit 125 may select one out of the plurality of sequences, and perform a check operation on threshold voltages of select transistors according to the selected sequence. Here, a sequence indicates an order of check operations of a plurality of select transistors included in a NAND string. According to the present exemplary embodiment, the sequence may be selected based on frequency of failures due to characteristics of the plurality of select transistors included in the NAND string. For example, in operation S210, the sequence in a first case may be selected out of various sequences shown in FIG. 9.

Figure 9:
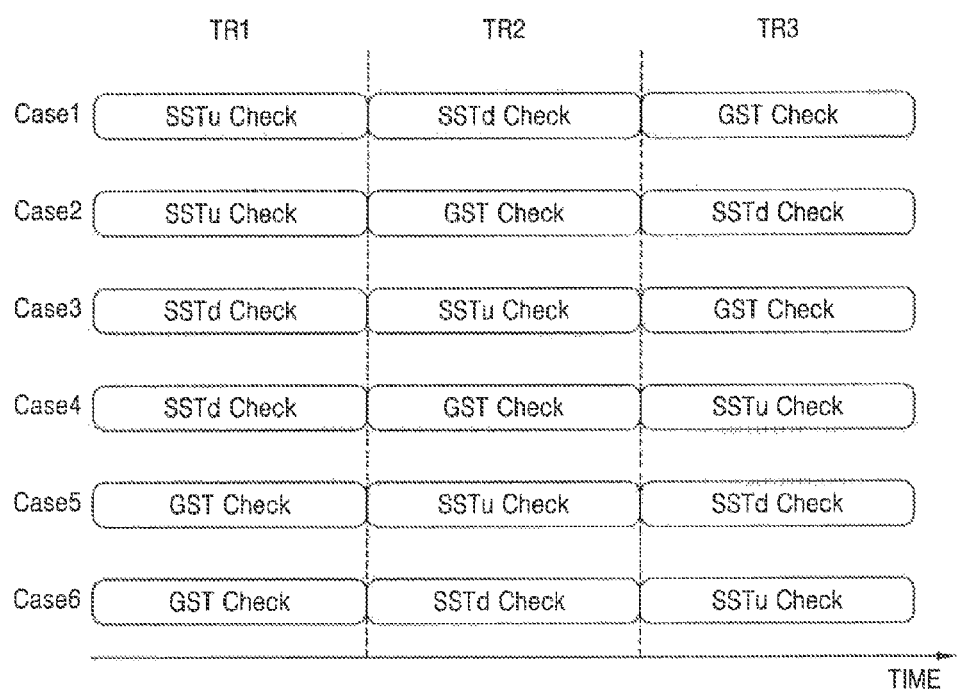
FIG. 9 shows various sequences of operations of checking select transistors according to an exemplary embodiment of the inventive concept.

FIG. 9 shows various sequences of operations of checking select transistors according to an exemplary embodiment of the inventive concept.

FIG. 9 illustrates an example in which in each case, a check operation is firstly performed on a first select transistor TR1, a check operation is secondly performed on a second select transistor TR2, and a check operation is thirdly performed on a third select transistor TR3. For example, in a first case, the sequence indicates that a check operation is firstly performed on an upper string select transistor SSTu, a check operation is secondly performed on a lower string select transistor SSTd, and a check operation is thirdly performed on a ground select transistor GST.

Referring back to FIG. 8, in operation S220, it may be determined whether a check operation is to be performed on the first select transistor TR1. If it is determined that the check operation is to be performed on the first select transistor TR1, the check operation may be performed on the first select transistor TR1 in operation S230. In this case, the check operation on the first select transistor TR1 may be substantially the same as operation S20 of FIG. 5.

In operation S250, it may be determined whether a check operation is to be performed on the second select transistor TR2. If it is determined that the check operation is to be performed on the second select transistor TR2, the check operation may be performed on the second select transistor TR2 in operation S260. In this case, the check operation on the second select transistor TR2 may be substantially the same as operation S20 of FIG. 5.

In operation S280, it may be determined whether a check operation is to be performed on the third select transistor TR3. If it is determined that the check operation is to be performed on the third select transistor TR3, the check operation may be performed on the third select transistor TR3 in operation S290. In this case, the check operation on the third select transistor TR3 may be substantially the same as operation S20 of FIG. 5.

FIG. 10 is a flowchart of an operation of checking a select transistor according to an exemplary embodiment of the inventive concept.

Referring to FIG. 10, the operation of checking the select transistor according to the present embodiment may correspond to operations S230, S260, and S290 of FIG. 8. In other words, the method selectively determines whether to perform the check operation on each select transistor. The select transistor may be one of the first to third select transistors TR1 to TR3 shown in FIGS. 8 and 9.

In operation S305, it may be determined whether a first check operation is to be performed on the select transistor. Here, the first check operation may be an under check operation on a threshold voltage of the select transistor and correspond to operation S120 of FIG. 5. If it is determined that the first check operation is to be performed, operation S310 may be performed. Otherwise, operation S340 may be performed.

In operation S310, the first check operation may be performed on the select transistor. In operation S315, it may be determined whether the first check operation is passed. If the first check operation failed, operation S320 may be performed. Otherwise, operation S340 may be performed.

In operation S320, it may be determined whether the select transistor is programmable. For example, it may be determined whether the select transistor is a programmable cell-type transistor. If the select transistor is determined as programmable, operation S330 may be performed. Otherwise, operation S370 may be performed. In operation S330, a program operation may be performed on the select transistor, and then a program verification operation may be performed on the select transistor. Here, the program operation may correspond to operation S140 of FIG. 5.

In operation S335, based on a result from the program verification operation, it may be determined whether the program operation is passed. If the program operation is passed, operation S340 may be performed. Otherwise, operation S380 may be performed. In operation S380, it may be determined whether a current loop is a predetermined maximum loop. If the current loop is determined as the maximum loop, operation S370 may be performed. Otherwise, a loop count may be increased, and the process may return to operation S330.

In operation S340, it may be determined whether a second check operation is to be performed on the select transistor. Here, the second check operation may be an upper check operation on a threshold voltage of the select transistor and corresponds to operation S150 of FIG. 5. If it is determined that the second check operation is to be performed, operation S345 may be performed. Otherwise, the check operation on the select transistor may be ended.

In operation S345, it may be determined whether to skip the second check operation on the select transistor. According to the present exemplary embodiment, when the program operation (e.g., operations S330, S335, and S380) is not performed on the select transistor, the second check operation may be skipped. If it is determined to skip the second check operation, operation S350 may be performed. Otherwise, operation S355 may be performed. In operation S350, it may be determined whether a program flag is 1. Here, the program flag may indicate whether the program operation has been performed. For example, when the program flag is 1, the program operation has been performed. When the program flag is 0, the program operation has not been performed. If the program flag is determined as 1, operation S355 may be performed. Otherwise, the check operation on the select transistor may be ended.

In operation S355, the second check operation may be performed on the select transistor. In operation S360, it may be determined whether the second check operation is passed. If the second check operation is passed, the check operation on the select transistor may be ended. Otherwise, if the second check operation is not passed, a memory block with the NAND string that includes the select transistor may be processed as a bad block in operation S370.

FIG. 11 is a diagram of an erase operation of a memory device, which includes an operation of checking select transistors, according to an exemplary embodiment of the inventive concept.

Referring to FIG. 11, according to the present exemplary embodiment, a bad block may be checked by performing a check operation on select transistors during an erase period for which an erase operation is performed on a selected memory block. For example, an erase stage ERASE for performing an erase operation on a plurality of memory cells included in the memory block and an erase verification stage ERS VFY for performing an erase verification operation on the plurality of memory cells may be sequentially performed. Thereafter, the memory block may be checked to determine if it is a bad block by performing the check operation on threshold voltages of the select transistors.

In the present exemplary embodiment, each of an upper string select transistor SSTu and a lower string select transistor SSTd may be a cell-type transistor including a charge storage layer. Similar to the memory cells, threshold voltages of the upper string select transistor SSTu and the lower string select transistor SSTd may be reduced with an increase in the number of program/erase cycles. Thus, threshold voltage distributions of the upper string select transistor SSTu and the lower string select transistor SSTd may be shifted in a negative direction. In this case, an under check operation may be firstly performed on the upper string select transistor SSTu and the lower string select transistor SSTd.

For example, the under check operation may be firstly performed on the upper string select transistor SSTu. If the upper string select transistor SSTu passes the under check operation, a program operation and an upper check operation on the upper string select transistor SSTu may be skipped. Thereafter, an under check operation may be performed on the lower string select transistor SSTd. If the lower string select transistor SSTd passes the under check operation, a program operation and an upper check operation on the lower string select transistor SSTd may be skipped.

In the present exemplary embodiment, the ground select transistor GST may be a normal transistor that does not include a charge storage layer. In this case, a distribution of the ground select transistor GST may not necessarily be shifted in a negative direction; however, random deterioration may occur. That is, the distribution of the ground select transistor GST may be shifted in either a negative direction or a positive direction. Accordingly, an under check operation and an upper check operation may be sequentially performed on the ground select transistor GST.

FIGS. 12A to 12D show various operations of checking select transistors according to exemplary embodiments of the inventive concept. In the examples of FIGS. 12A to 12D, an upper string select transistor SSTu and a lower string select transistor SSTd may be programmable cell-type transistors, and a ground select transistor GST may be a normal, unprogrammable transistor.

Figure 12A:
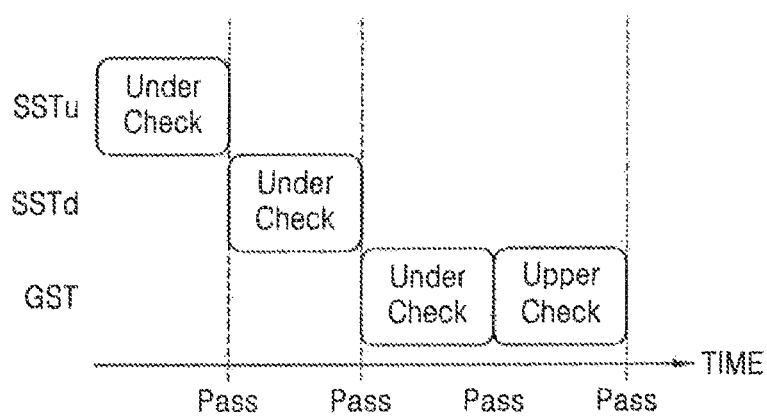
FIGS. 12A to 12D show various operations of checking select transistors according to exemplary embodiments of the inventive concept.

Referring to FIG. 12A, distributions of upper string select transistors SSTu, lower string select transistors SSTd, and ground select transistors GST may be within a normal range in a memory block. In other words, distributions of upper string select transistors SSTu, lower string select transistors SSTd, and ground select transistors GST may not be shifted in a negative direction or a positive direction. Thus, when check operations are performed on the select transistors, each of the check operations may be passed as shown in FIG. 12A.

According to the present exemplary embodiment, an under check operation may be firstly performed on the upper string select transistor SSTu. If the upper string select transistor SSTu passes the under check operation, an under check operation may be performed on the lower string select transistor SSTd. If the lower string select transistor SSTd passes the under check operation, an under check operation may be performed on the ground select transistor GST. If the ground select transistor GST passes the under check operation, an upper check operation may be performed on the ground select transistor GST.

Figure 12B:
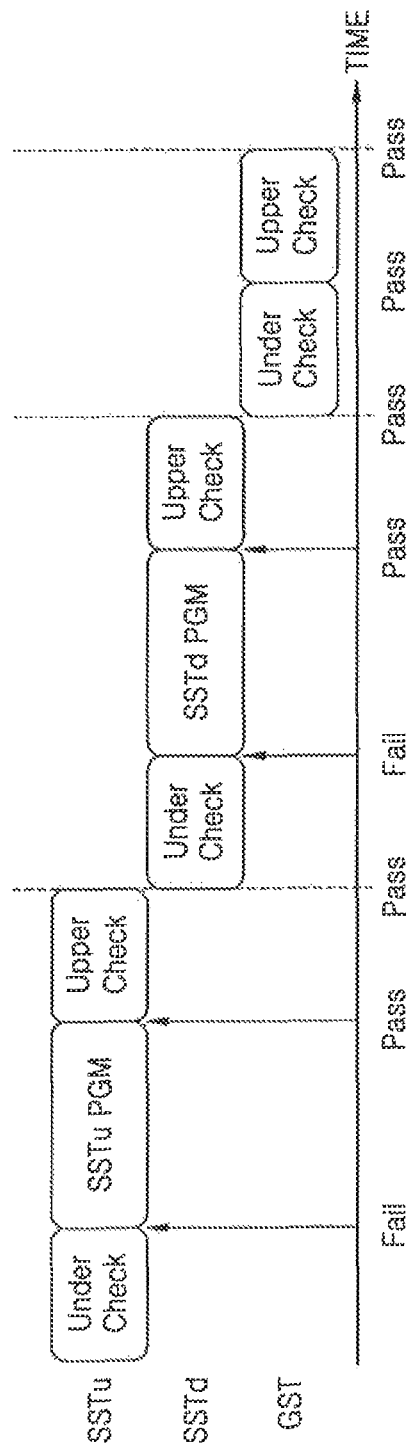

Referring to FIG. 12B, when a distribution of upper string select transistors SSTu and a distribution of lower string select transistors SSTd are shifted in a negative direction from a normal range, the upper string select transistor SSTu and the lower string select transistor SSTd may fail the under check operations. Thus, program operations may be performed on the upper string select transistor SSTu and the lower string select transistor SSTd so that a distribution of upper string select transistors SSTu and a distribution of lower string select transistors SSTd may be shifted in a positive direction.

According to the present exemplary embodiment, an under check operation may be firstly performed on the upper string select transistor SSTu. If the upper string select transistor SSTu fails the under check operation, a program operation may be performed on the upper string select transistor SSTu. If the upper string select transistor SSTu passes the program operation based on a program verification result, an upper check operation may be performed on the upper string select transistor SSTu. If the upper string select transistor SSTu passes the upper check operation, an under check operation may be performed on the lower string select transistor SSTd. If the lower string select transistor SSTd fails the under check operation, a program operation may be performed on the lower string select transistor SSTd. If the lower string select transistor SSTd passes the program operation based on a program verification result, an upper check operation may be performed on the lower string select transistor SSTd. If the lower string select transistor SSTd passes the upper check operation, an under check operation may be performed on the ground select transistor GST. If the ground select transistor GST passes the under check operation, an upper check operation may be performed on the ground select transistor GST.

Figure 12C:
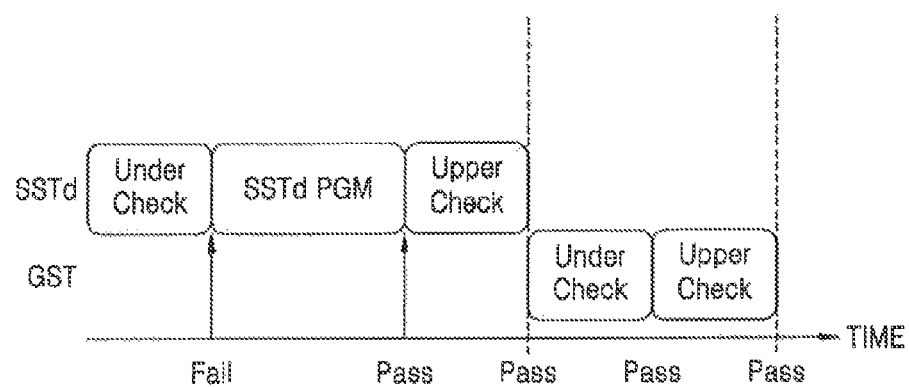

Referring to FIG. 12C, a check operation on the upper string select transistor SSTu may be skipped, and check operations may be performed on only the lower string select transistor SSTd and the ground select transistor GST. Since the lower string select transistor SSTd is located relatively adjacent to the memory cells, deterioration of the memory cells due to program and erase operations may worsen. In contrast, since the upper string select transistor SSTu is located relatively far from the memory cells, deterioration of the memory cells due to the program and erase operations may ease.

According to the present exemplary embodiment, an under check operation may be performed on the lower string select transistor SSTd. If the lower string select transistor SSTd fails the under check operation, a program operation may be performed on the lower string select transistor SSTd. If the lower string select transistor SSTd passes the program operation based on a program verification result, an upper check operation may be performed on the lower string select transistor SSTd. If the lower string select transistor SSTd passes the upper check operation, an under check operation may be performed on the ground select transistor GST. If the ground select transistor GST passes the under check operation, an upper check operation may be performed on the ground select transistor GST.

Figure 12D:
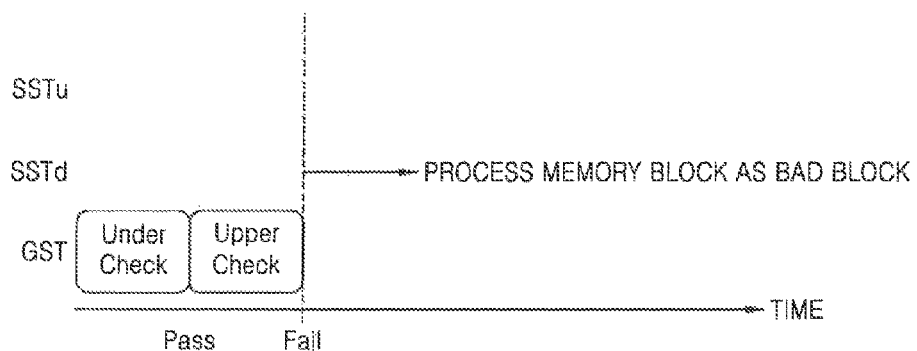

Referring to FIG. 12D, a check operation may be performed on only the ground select transistor GST. For example, an under check operation may be performed on the ground select transistor GST. If the ground select transistor GST passes the under check operation, an upper check operation may be performed on the ground select transistor GST. If the ground select transistor GST fails the upper check operation, since the ground select transistor GST is incapable of a program operation, a memory block including the corresponding NAND string may be processed as a bad block. However, the inventive concept is not limited thereto. For example, only the corresponding NAND string may be processed as a bad string, and other NAND strings included in the memory block may not be processed as bad strings.

Figure 13:
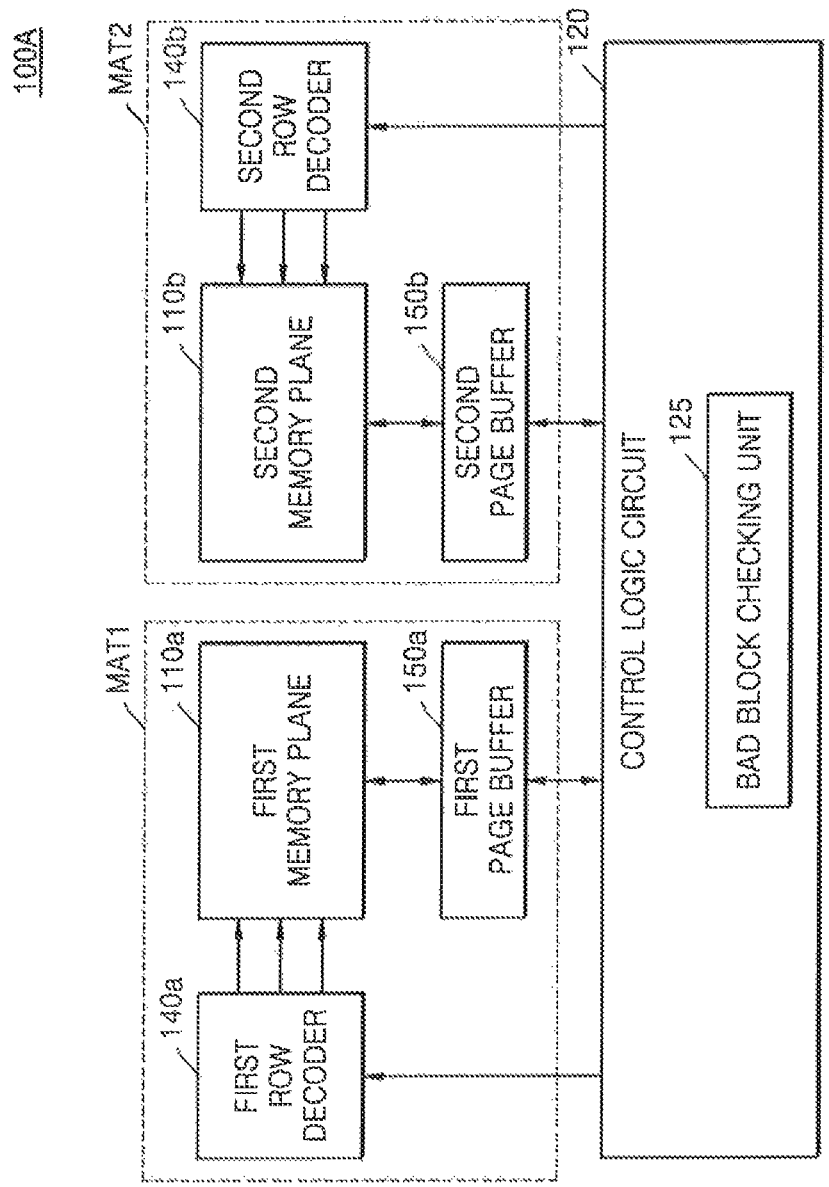
FIG. 13 is a block diagram of a memory device according to an exemplary embodiment of the inventive concept.

FIG. 13 is a block diagram of a memory device 100A according to an exemplary embodiment of the inventive concept.

Referring to FIG. 13, the memory device 100A may include a first mat MAT1, a second mat MAT2, and a control logic circuit 120. The first mat MAT1 may include a first memory plane 110a, a first row decoder 140a, and a first page buffer 150a, and the second mat MAT2 may include a second memory plane 110b, a second row decoder 140b, and a second page buffer 150b. The memory device 110A, according to the present exemplary embodiment, may be a modified example of the memory device 100 of FIG. 1 and be divided into a plurality of mats (e.g., MAT1 and MAT2), which may be controlled independently of one another. FIG. 13 illustrates two mats MAT1 and MAT2, but the inventive concept is not limited thereto. The number of mats included in the memory device 100A may be variously changed according to exemplary embodiments of the inventive concept.

The control logic circuit 120 may independently and simultaneously control an operation on the first memory plane 110a and an operation on the second memory plane 110b. The bad block checking unit 125 may independently and simultaneously perform an operation of checking whether there is a bad block among a plurality of memory blocks included in the first memory plane 110a and an operation of checking whether there is a bad block among a plurality of memory blocks included in the second memory plane 110b. The descriptions of the bad block checking unit 125 with reference to FIG. 1 may be applied to the present embodiment.

Figure 14:
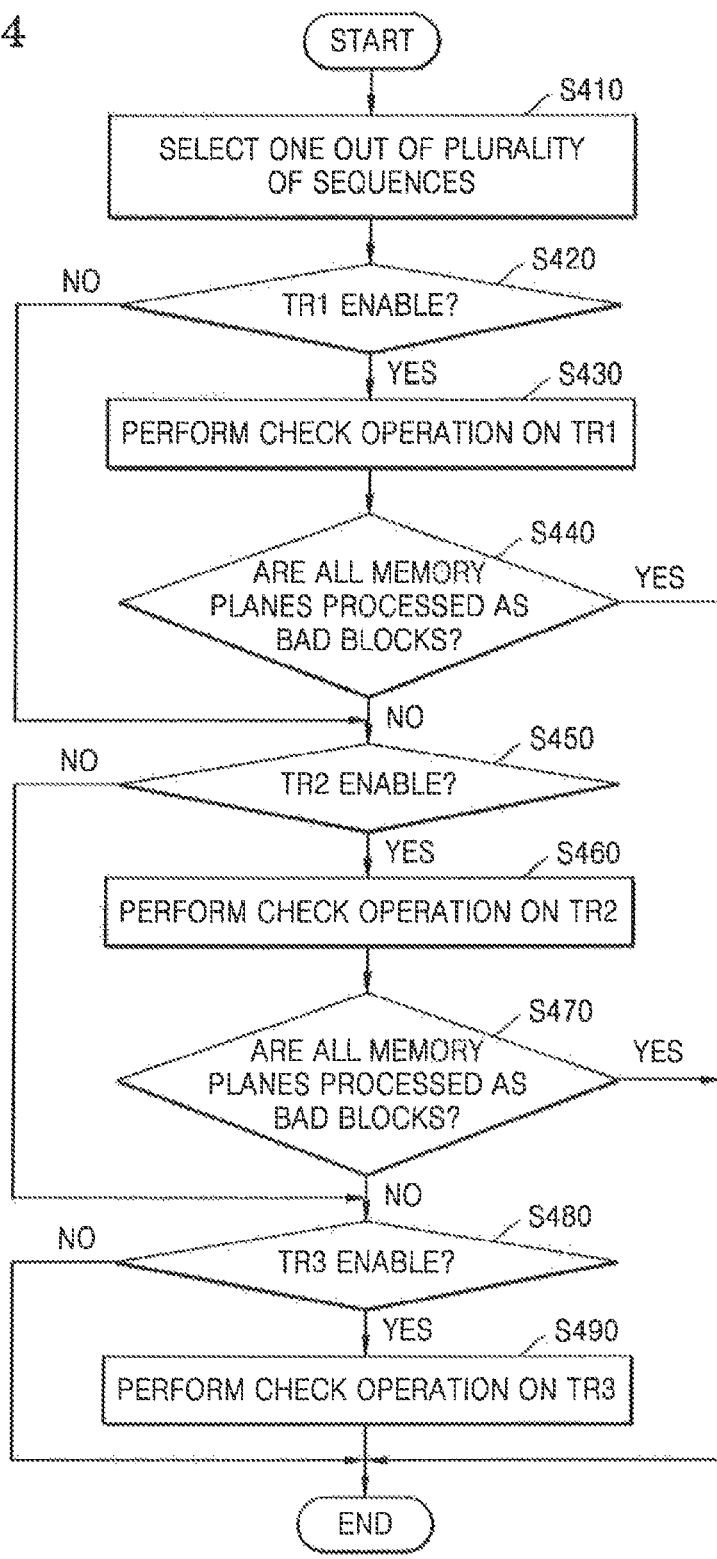
FIG. 14 is a flowchart of a method of operating a memory device according to an exemplary embodiment of the inventive concept.

FIG. 14 is a flowchart of a method of operating a memory device according to an exemplary embodiment of the inventive concept.

Referring to FIG. 14, the method of operating the memory device may be a method of performing a bad block check operation with respect to memory blocks included in the memory device. The method may include operations performed in a temporal sequence by the memory device 100A of FIG. 13. Accordingly, the method of operating the memory device according to the present exemplary embodiment may be referred to as an on-chip checking method. The detailed descriptions of the memory device 100A with reference to FIG. 13 may be applied to the present exemplary embodiment, and repeat descriptions will be omitted.

In operation S410, one of a plurality of predefined sequences may be selected. For example, the bad block checking unit 125 may select one out of the plurality of predefined sequences, and perform a check operation on threshold voltages of select transistors according to the selected sequence. Here, a sequence indicates an order of check operations of a plurality of select transistors included in a NAND string. For example, in operation S410, a sequence corresponding to a first case may be selected out of various sequences shown in FIG. 9.

In operation S420, it may be determined whether a check operation is to be performed on a first select transistor TR1. If it is determined that the check operation is to be performed on the first select transistor TR1, the check operation may be performed on the first select transistor TR1 in operation S430. In this case, the check operation on the first select transistor TR1 may be substantially the same as operation S20 of FIG. 5.

In the present exemplary embodiment, the bad block checking unit 125 may simultaneously perform a bad block check operation on a first memory block of a first memory plane 110a and a bad block check operation on a first memory block of a second memory plane 110b. For example, the bad block checking unit 125 may perform a check operation on an upper string select transistor of a first NAND string of the first memory block of the first memory plane 110a and simultaneously, perform a check operation on an upper string select transistor of a first NAND string of the first memory block of the second memory plane 110b.

In operation 5440, it may be determined whether all memory planes are processed as bad blocks. If it is determined that all the memory planes are not processed as bad blocks, operation S450 may be performed. Otherwise, the bad block check operation may be ended. For example, when both the first and second memory planes 110a and 110b are processed as bad blocks, the bad block checking unit 125 may skip subsequent operations and end the bad block check operation. Thus, the time taken for the bad block check operation may be reduced.

In operation S450, it may be determined whether a check operation is to be performed on a second select transistor TR2. If it is determined that the check operation is to be performed on the second select transistor TR2, the check operation may be performed on the second select transistor TR2 in operation S460. In this case, the check operation on the second select transistor TR2 may be substantially the same as operation S20 of FIG. 5.

For example, during operation S460, the bad block checking unit 125 may perform a check operation on a lower string select transistor of the first NAND string of the first memory block of the first memory plane 110a and simultaneously, perform a check operation on a lower string select transistor of the first NAND string of the first memory block of the second memory plane 110b.

In operation 5470, it may be determined whether all memory planes are processed as bad blocks. If it is determined that all the memory planes are not processed as bad blocks, operation S480 may be performed. Otherwise, the bad block check operation may be ended. For example, when both the first and second memory planes 110a and 110b are processed as bad blocks, the bad block checking unit 125 may skip subsequent operations and end the bad block check operation. Thus, the time taken for the bad block check operation may be reduced.

In operation S480, it may be determined whether a check operation is to be performed on a third select transistor TR3. If it is determined that the check operation is to be performed on the third select transistor TR3, the check operation may be performed on the third select transistor TR3 in operation S490. In this case, the check operation on the third select transistor TR3 may be substantially the same as operation S20 of FIG. 5. As can be seen, in operations S420, S450, and S480, a check operation may be selectively determined.

Figure 15:
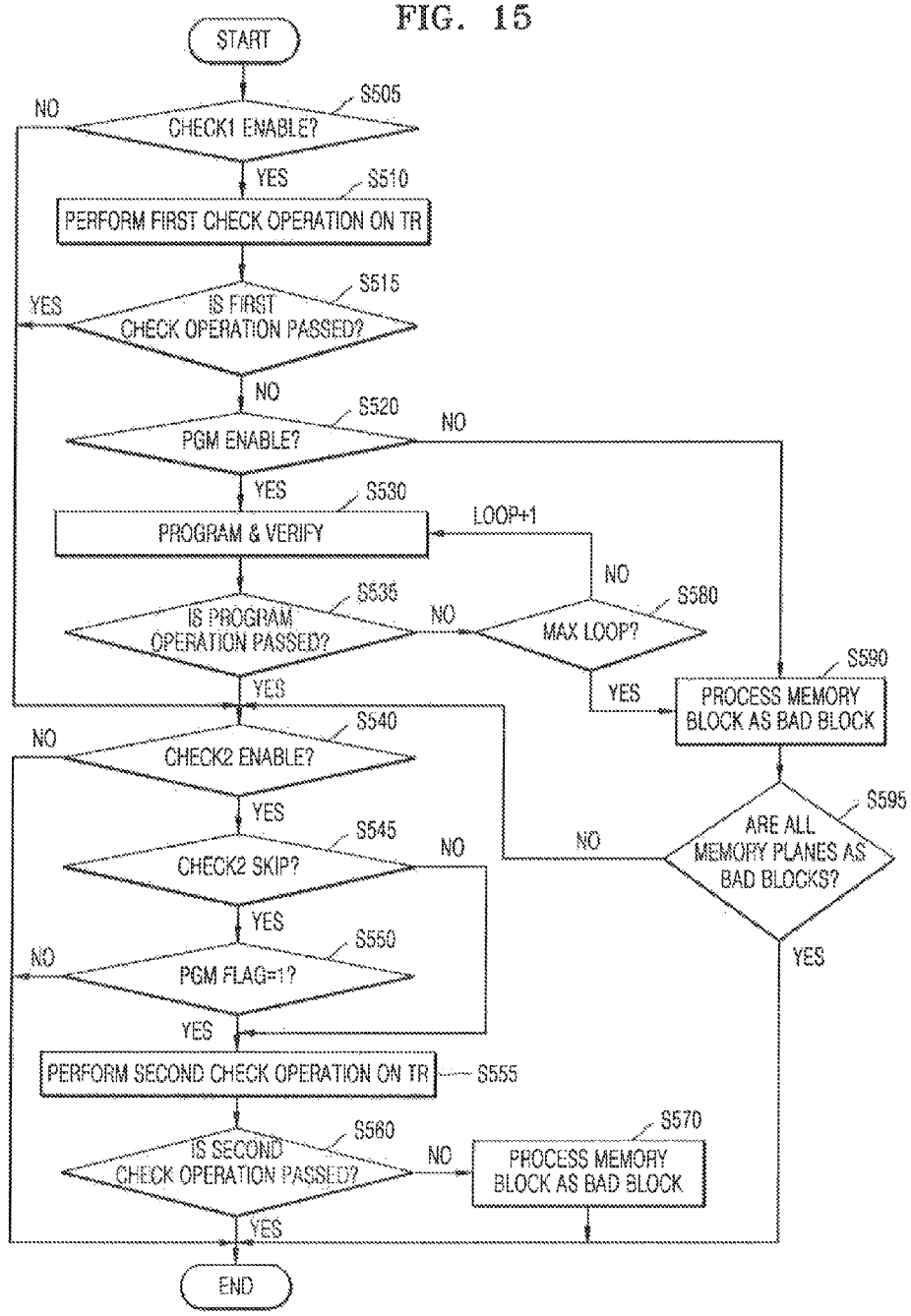
FIG. 15 is a flowchart of an operation of checking a select transistor according to an exemplary embodiment of the inventive concept.

FIG. 15 is a flowchart of an operation of checking a select transistor according to an exemplary embodiment of the inventive concept.

Referring to FIG. 15, the operation of checking the select transistor according to the present exemplary embodiment may correspond to operations S430, S460, and S490 of FIG. 14. A select transistor may be one of the first to third select transistors TR1 to TR3 shown in FIGS. 8 to 14.

In operation S505, it may be determined whether a first check operation is to be performed on the select transistor. Here, the first check operation may be an under check operation on a threshold voltage of the select transistor, and correspond to operation S120 of FIG. 5. According to the present exemplary embodiment, when the check operation is performed on the select transistor, it may be optionally determined whether the first check operation (e.g., the under check operation) is to be performed. If the determination result is that the first check operation is to be performed, operation S510 may be performed. Otherwise, operation S540 may be performed.

In operation S510, the first check operation may be performed on the select transistor. In operation S515, it may be determined whether the first check operation is passed. If the first check operation is failed, operation S520 may be performed. Otherwise, operation S540 may be performed.

In operation S520, it may be determined whether the select transistor is programmable. For example, it may be determined whether the select transistor is a programmable cell-type transistor. If the select transistor is determined as programmable, operation S530 may be performed. Otherwise, operation S590 may be performed. In operation S530, a program operation may be performed on the select transistor, and then a program verification operation may be performed on the select transistor.

In operation S535, based on a result of the program verification operation, it may be determined whether the program operation is passed. If the program operation is passed, operation S540 may be performed. Otherwise, operation S580 may be performed. In operation S580, it may be determined whether a current loop is a predetermined maximum loop. If the current loop is determined as the predetermined maximum loop, operation S590 may be performed. Otherwise, a loop count may be increased, and the process may return to operation S530.

In operation S590, a memory block with a NAND string that includes the select transistor may be processed as a bad block. In operation S595, it may be determined whether all memory planes are processed as bad blocks. If all the memory planes are not determined as the bad blocks, operation S540 may be performed. Otherwise, a bad block check operation may be ended. For example, when both the first and second memory planes 110a and 110b are processed as bad blocks, the bad block checking unit 125 may skip subsequent operations and end the bad block check operation. Thus, the time taken for the bad block check operation may be reduced.

In operation S540, it may be selectively determined whether a second check operation is to be performed on the select transistor. Here, the second check operation may be an upper check operation on a threshold voltage of the select transistor and correspond to operation S150 of FIG. 5. If it is determined that the second check operation is to be performed, operation S545 may be performed. Otherwise, the bad block check operation on the select transistor may be ended.

In operation S545, it may be determined whether to skip the second check operation on the select transistor. According to the present exemplary embodiment, when a program operation (e.g., operations S530, S535, and S580) is not performed on the select transistor, the second check operation may be skipped. If it is determined to skip the second check operation, operation S550 may be performed. Otherwise, operation S555 may be performed. In operation S550, it may be determined whether a program flag is 1. Here, the program flag indicates whether the program operation has been performed. For example, when the program flag is 1, the program operation has been performed. When the program flag is 0, the program operation has not been performed. If the program flag is determined as 1, operation S555 may be performed. Otherwise, the bad block check operation on the select transistor may be ended.

In operation S555, the second check operation may be performed on the select transistor. In operation S560, it may be determined whether the second check operation is passed. If the second check operation is passed, the bad block check operation on the select transistor may be ended. If the second check operation is not passed, a memory block with the NAND string that includes the select transistor may be processed as a bad block in operation S570.

Figure 16:
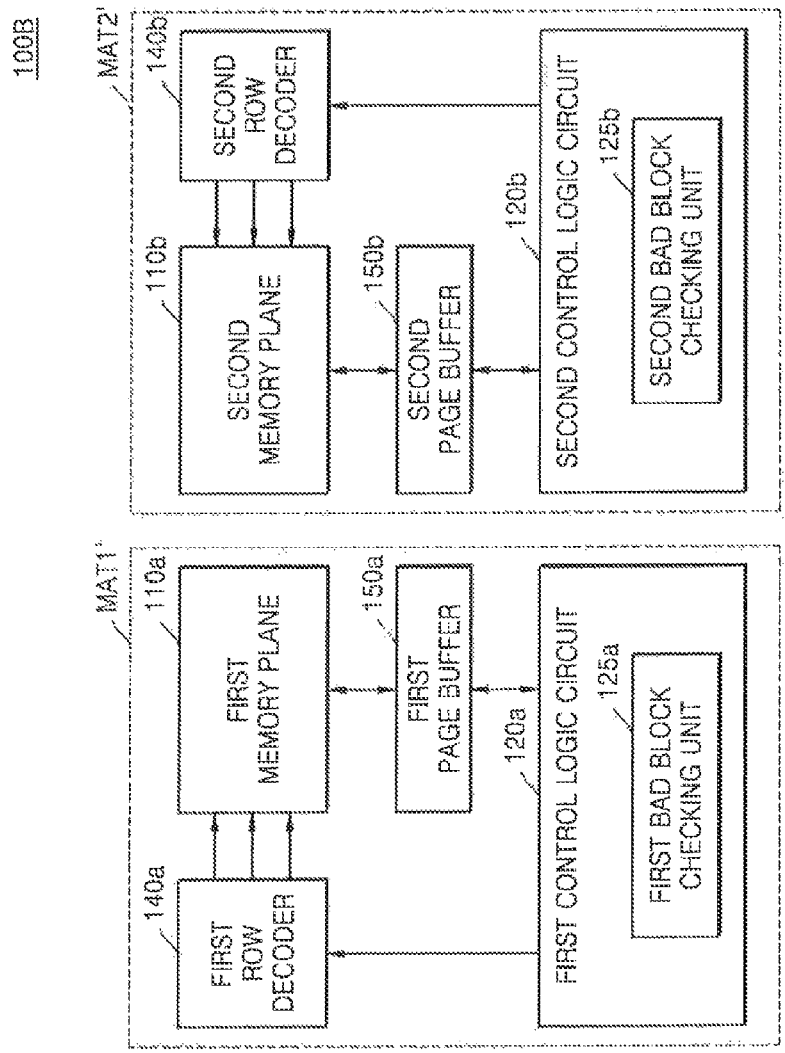
FIG. 16 is a block diagram of a memory device according to an exemplary embodiment of the inventive concept.

FIG. 16 is a block diagram of a memory device 100B according to an exemplary embodiment of the inventive concept.

Referring to FIG. 16, the memory device 100B may include a first mat MAT1' and a second mat MAT2'. The first mat MAT1' may include a first memory plane 110a, a first control logic circuit 120a, a first row decoder 140a, and a first page buffer 150a, and the first control logic circuit 120a may include a first bad block checking unit 125a. The second mat MAT2' may include a second memory plane 110b, a second control logic circuit 120b, a second row decoder 140b, and a second page buffer 150b, and the second control logic circuit 120b may include a second bad block checking unit 125b.

The memory device 100B according to the present exemplary embodiment may be a modified example of the memory device 100A of FIG. 13. According to the present exemplary embodiment, the first and second mats MAT1' and MAT2' included in the memory device 100B may include the first and second control logic circuits 120a and 120b, respectively. In this case, the first bad block checking unit 125a included in the first control logic circuit 120a may check whether there is a bad block in the first memory plane 110a, while the second bad block checking unit 125b included in the second control logic circuit 120b may check whether there is a bad block in the second memory plane 110b. Accordingly, the first and second bad block checking units 125a and 125b may operate according to the method shown in FIGS. 8 and 10.

Figure 17:
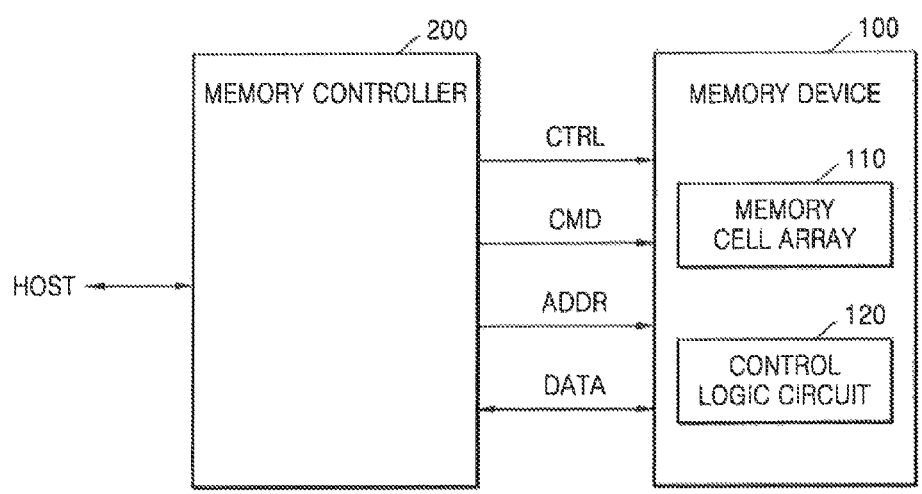
FIG. 17 is a block diagram of a memory system according to an exemplary embodiment of the inventive concept.

FIG. 17 is a block diagram of a memory system 10 according to an exemplary embodiment of the inventive concept.

Referring to FIG. 17, the memory system 10 may include a memory device 100 and a memory controller 200, and the memory device 100 may include a memory cell array 110 and a control logic circuit 120. In the present exemplary embodiment, the memory device 100 of FIG. 17 may correspond to the memory device 100 of FIG. 1, the memory device 100A of FIG. 13, or the memory device 100B of FIG. 16.

The memory controller 200 may control the memory device 100 to read data stored in the memory device 100 or write data to the memory device 100 in response to read/write requests from a host HOST. For example, the memory controller 200 may provide an address ADDR, a command CMD, and a control signal CTRL to the memory device 100 and control a program (or write) operation, a read operation, and an erase operation on the memory device 100. In addition, data DATA to be programmed/read may be transmitted between the memory controller 200 and the memory device 100.

The memory cell array 110 may include a plurality of memory cells. For example, the plurality of memory cells may be flash memory cells. In the present embodiment, the memory cell array 110 may include a plurality of memory blocks, each of which may include a plurality of NAND strings. Each of the plurality of NAND strings may include a plurality of memory cells, which are connected to a plurality of word lines vertically stacked on a substrate. The descriptions of the memory cell array 110 with reference to FIG. 1 may also be applied to the present exemplary embodiment.

The control logic circuit 120 may output various control signals for writing data to the memory cell array 110, reading data from the memory cell array 110, or erasing data stored in the memory cell array 110, based on the command CMD, the address ADDR, and the control signal CTRL received from the memory controller 200. Thus, the control logic circuit 120 may control various operations of the memory device 100. The descriptions of the control logic circuit 120 with reference to FIG. 1 may also be applied to the present exemplary embodiment.

According to the present exemplary embodiment, the control logic circuit 120 may perform a check operation on a threshold voltage of each of a plurality of select transistors (e.g., the upper string select transistor SSTu, the lower string select transistor SSTd, and the ground select transistor GST of FIG. 2) included in the NAND string, and may process a memory block including some NAND strings as a bad block based on a result of the check operation. The control logic circuit 120 may be configured to perform the methods described above with reference to FIGS. 1 to 16.

Figure 18:
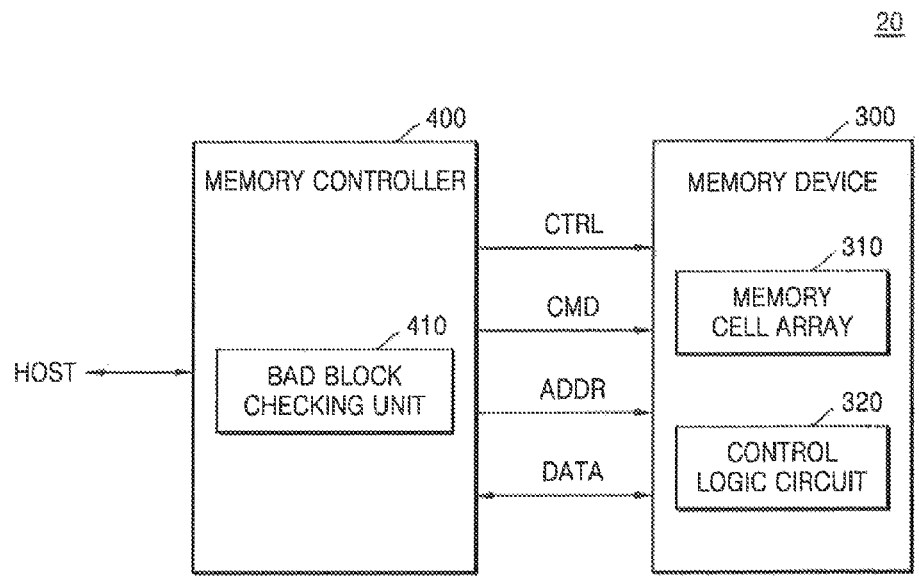
FIG. 18 is a block diagram of a memory system according to an exemplary embodiment of the inventive concept.

FIG. 18 is a block diagram of a memory system 20 according to an exemplary embodiment of the inventive concept.

Referring to FIG. 18, the memory system 20 may include a memory device 300 and a memory controller 400. The memory system 20 according to the present exemplary embodiment may be a modified example of the memory system 10 of FIG. 17. For example, the memory controller 400 may include a bad block checking unit 410.

The memory cell array 310 may include a plurality of memory cells. For example, the plurality of memory cells may be flash memory cells. In the present exemplary embodiment, the memory cell array 310 may include a plurality of memory blocks, each of which may include a plurality of NAND strings. Each of the plurality of NAND strings may include a plurality of memory cells, which are connected to a plurality of word lines vertically stacked on a substrate. The descriptions of the memory cell array 110 with reference to FIG. 1 may also be applied to the present exemplary embodiment.

The control logic circuit 320 may output various control signals for writing data to the memory cell array 310, reading data from the memory cell array 310, or erasing data stored in the memory cell array 310, based on a command CMD, an address ADDR, and a control signal CTRL received from the memory controller 400. Thus, the control logic circuit 320 may control various operations of the memory device 300.

The bad block checking unit 410 may perform a check operation on a threshold voltage of each of a plurality of select transistors (e.g., the upper string select transistor SSTu, the lower string select transistor SSTd, and the ground select transistor GST of FIG. 2) included in the NAND string, and may process a memory block including some NAND strings as a bad block based on a result of the check operation. Thus, according to the present exemplary embodiment, a bad block check operation may be performed by the memory controller 400. The bad block checking unit 410 may be configured to perform the methods described above with reference to FIGS. 1 to 16.

Figure 19:
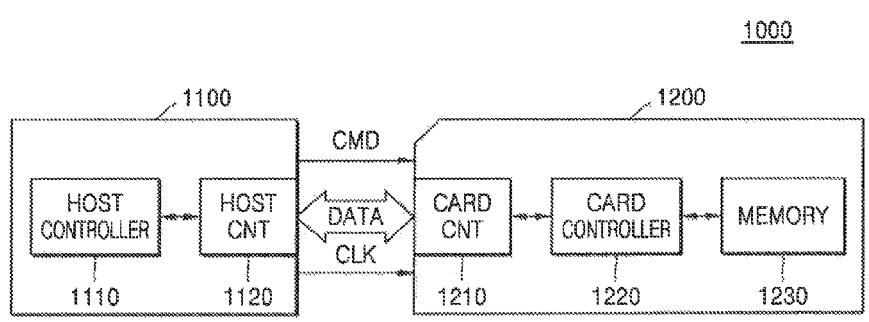
FIG. 19 is a block diagram of a memory card system according to an exemplary embodiment of the inventive concept.

FIG. 19 is a block diagram of a memory card system 1000 according to an exemplary embodiment of the inventive concept.

Referring to FIG. 19, the memory card system 1000 may include a host 1100 and a memory card 1200. The host 1100 may include a host controller 1110 and a host connector 1120. The memory card 1200 may include a card connector 1210, a card controller 1220, and a memory device 1230. In this case, the memory card 1200 may correspond to the exemplary embodiments shown in FIGS. 1 to 18.

For example, the memory card 1200 may perform a check operation on a threshold voltage of each of a plurality of select transistors (e.g., the upper string select transistor SSTu, the lower string select transistor SSTd, and the ground select transistor GST of FIG. 2) included in the NAND string, and may process a memory block including some NAND strings as a bad block based on a result of the check operation. In this case, the memory card 1200 may selectively determine whether a program operation and an upper check operation are to be performed, based on a result of an under check operation on each of the select transistors. In addition, the memory card 1200 may variously determine the order of check operations on the plurality of select transistors included in the NAND string and whether the check operations are to be performed on the select transistors included in the NAND string.

The memory card 1200 may communicate with the host 1100 through at least one of various interface protocols, such as a universal serial bus (USB), a multimedia card (MMC), peripheral component interface-express (PCI-E), advanced technology attachment (ATA), serial-ATA (SATA), parallel-ATA (PATA), a small computer system interface (SCSI), an enhanced small device interface (ESDI), or an intelligent drive electronics (IDE).

The host 1100 may write data to the memory card 1200 or read data stored in the memory card 1200. The host controller 1110 may transmit a command CMD, a clock signal CLK generated by a clock generator in the host 1100, and data DATA to the memory card 1200 through the host connector 1120. The host controller 1110 may also receive data DATA from the memory card 1200 through the host connector 1120.

The card controller 1220 may store data in the memory device 1230 in synchronization with a clock signal generated by a clock generator in the card controller 1220 and in response to a command received through the card connector 1210. The memory device 1230 may store data DATA transmitted from the host 1100.

The memory card 1200 may be embodied by a compact flash card (CFC), a microdrive, a smart media card (SMC), an MMC, a security digital card (SDC), a memory stick, a USB flash memory driver, etc.

Figure 20:
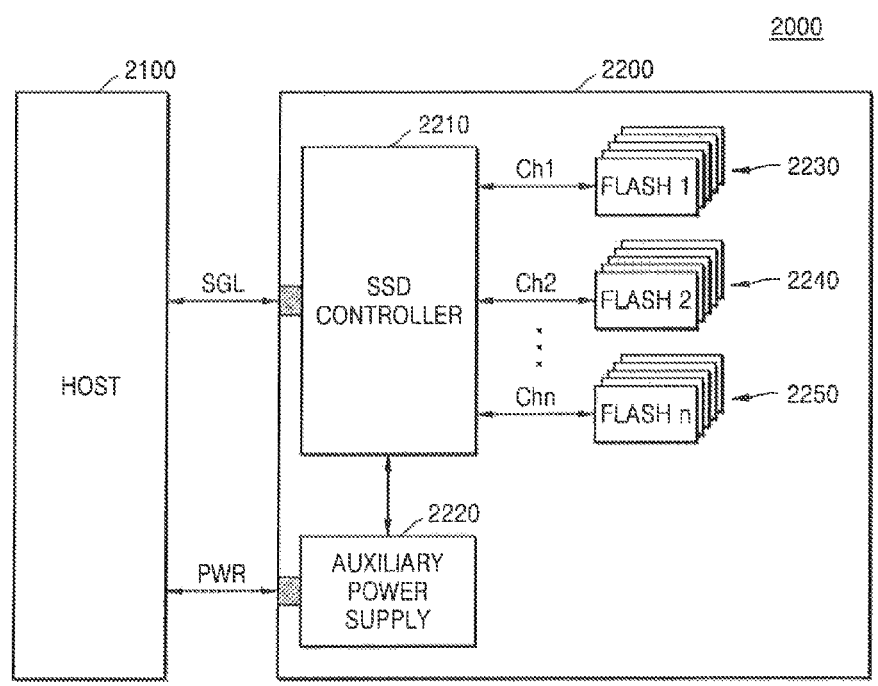
FIG. 20 is a block diagram of a solid-state drive (SSD) system according to an exemplary embodiment of the inventive concept.

FIG. 20 is a block diagram of a solid-state drive (SSD) system 2000 according to an exemplary embodiment of the inventive concept.

Referring to FIG. 20, the SSD system 2000 may include a host 2100 and an SSD 2200. The SSD 2200 may transmit and receive signals to and from the host 2100 through a signal connector (e.g., SGL) and receive power through a power connector (e.g., PWR). The SSD 2200 may include an SSD controller 2210, an auxiliary power supply 2220, and a plurality of memory devices 2230, 2240, and 2250. In this case, the SSD 2200 may correspond to the exemplary embodiments shown in FIGS. 1 to 19.

For example, each of the plurality of memory devices 2230 to 2250 may perform a check operation on a threshold voltage of each of a plurality of select transistors (e.g., the upper string select transistor SSTu, the lower string select transistor SSTd, and the ground select transistor GST) included in a NAND string, and may process a memory block including some NAND strings as a bad block based on a result of the check operation. In this case, each of the plurality of memory devices 2230 to 2250 may selectively determine whether a program operation and an upper check operation are to be performed, based on a result of an under check operation on each of the select transistors. In addition, each of the plurality of memory devices 2230 to 2250 may variously determine the order of check operations on the plurality of select transistors included in the NAND string and whether the check operations are to be performed on the select transistors included in the NAND string.

A memory card, a non-volatile memory device, and a card controller according to exemplary embodiments of the inventive concept may be mounted by packages having various shapes. For example, a flash memory device and/or a memory controller according to exemplary embodiments of the inventive concept may be mounted by using a Package on Package (PoP) technique, a ball grid array (BGA) technique, a chip-scale package (CSP) technique, a plastic-leaded chip carrier (PLCC) technique, a plastic dual in-line package (PDIP) technique, a die-in-waffle-pack technique, a die-in-wafer-form technique, a chip-on-board (COB) technique, a ceramic dual in-line package (CERDIP) technique, a plastic metric quad flat-pack (MQFP) technique, a thin quad flat-pack (TQFP) technique, a small outline integrated circuit (SOIC) technique, a shrink small outline package (SSOP) technique, a thin small outline (TSOP) technique, a system-in-package (SIP) technique, a multi-chip package (MCP) technique, a wafer-level fabricated package (WFP) technique, or a wafer-level processed stack package (WSP) technique.

While the inventive concept has been shown and described with reference to exemplary embodiments thereof, it will be apparent to those of ordinary skill in the art that various changes in form and detail may be made thereto without departing from the spirit and scope of inventive concept as defined by the following claims.

What is claimed is:

1. A method of operating a non-volatile memory device including first and second memory planes independently controllable of one another, wherein each of the first and second memory planes includes a plurality of memory blocks, and each of the plurality of memory blocks includes a plurality of NAND strings, the method comprising:
   selecting a first select transistor from among a plurality of select transistors included in a first NAND string of a first memory block of each of the first and second memory planes;
   checking whether a first threshold voltage of the first select transistor of each of the first and second memory planes is within a first reference voltage range;
   processing the first memory block of the first memory plane as a bad block when the first threshold voltage of the first select transistor of the first memory plane is not within the first reference voltage range; and
   processing the first memory block of the second memory plane as a bad block when the first threshold voltage of the first select transistor of the second memory plane is not within the first reference voltage range,
   wherein when both the first memory block of the first memory plane and the first memory block of the second memory plane are processed as bad blocks, a check operation on the remaining select transistors from among the plurality of select transistors is skipped.

2. The method of claim 1, when both the first memory block of the first memory plane and the first memory block of the second memory plane are not processed as bad blocks, the method further comprises:
   selecting a second select transistor from among the plurality of select transistors included in the first NAND string of the first memory block of each of the first and second memory planes; and
   checking whether a second threshold voltage of the second select transistor of each of the first and second memory planes is within a second reference voltage range.

3. The method of claim 1, wherein checking whether the first threshold voltage is within the first reference voltage range comprises:
   comparing the first threshold voltage with a first lower-limit reference voltage level; and
   performing a program operation on the first select transistor when the first threshold voltage is lower than the first lower-limit reference voltage level,
   wherein checking the first threshold voltage is ended when the first threshold voltage is equal to or higher than the first lower-limit reference voltage level.

4. The method of claim 3, wherein checking whether the first threshold voltage is within the first reference voltage range further comprises comparing the first threshold voltage with a first upper-limit reference voltage level after performing the program operation.

* * * * *